(12) United States Patent
Jang et al.

(10) Patent No.: US 12,402,240 B2
(45) Date of Patent: Aug. 26, 2025

(54) SILICON CARBIDE THERMAL BRIDGE INTEGRATED ON A LOW THERMAL CONDUCTIVITY SUBSTRATE AND PROCESSES IMPLEMENTING THE SAME

(71) Applicant: WOLFSPEED, INC., Durham, NC (US)

(72) Inventors: Haedong Jang, San Jose, CA (US); Marvin Marbell, Cary, NC (US); Jeremy Fisher, Raleigh, NC (US)

(73) Assignee: Wolfspeed, Inc., Durham, NC (US)

( * ) Notice: Subject to any disclaimer, the term of this patent is extended or adjusted under 35 U.S.C. 154(b) by 282 days.

(21) Appl. No.: 18/296,461

(22) Filed: Apr. 6, 2023

(65) Prior Publication Data

US 2024/0341026 A1   Oct. 10, 2024

(51) Int. Cl.
- H05K 1/02 (2006.01)
- H05K 1/11 (2006.01)
- H05K 1/18 (2006.01)
- H01L 25/16 (2023.01)

(52) U.S. Cl.
CPC .......... *H05K 1/0201* (2013.01); *H05K 1/116* (2013.01); *H05K 1/181* (2013.01); *H01L 25/162* (2013.01); *H05K 2201/0326* (2013.01); *H05K 2201/066* (2013.01); *H05K 2201/10015* (2013.01)

(58) Field of Classification Search
CPC .................................................. H05K 1/0201
USPC ....................................................... 174/252
See application file for complete search history.

(56) References Cited

U.S. PATENT DOCUMENTS

2019/0305205 A1\*   10/2019   Feichtinger .......... H05K 1/0259

\* cited by examiner

*Primary Examiner* — Stanley Tso
(74) *Attorney, Agent, or Firm* — BakerHostetler

(57) ABSTRACT

A component includes a substrate board; a thermal bridge structured and arranged on the substrate board, where the thermal bridge is configured to transfer heat from the substrate board including an area adjacent to or on a hotspot of the substrate board; where the thermal bridge is configured to transfer the heat to another location on the substrate board for removal of the heat from the substrate board; and where the thermal bridge may include silicon carbide.

24 Claims, 17 Drawing Sheets

SILICON CARBIDE THERMAL BRIDGE INTEGRATED ON A LOW THERMAL CONDUCTIVITY SUBSTRATE AND PROCESSES IMPLEMENTING THE SAME

FIELD OF THE DISCLOSURE

The disclosure relates to a silicon carbide (SiC) thermal bridge integrated on a low thermal conductivity substrate and processes implementing the same. The disclosure further relates to a non-electrically-conductive SiC thermal bridge integrated on a low thermal conductivity substrate and processes implementing the same. The disclosure additionally relates to non-electrically-conductive SiC thermal bridge integrated on a low thermal conductivity substrate for RF power devices and processes implementing the same.

BACKGROUND OF THE DISCLOSURE

Transistor packages such as radio frequency (RF) power amplifier transistor packages typically implement a number of components mounted on low thermal conductivity substrates, such as printed circuit board (PCB) based substrates, PCB based material substrates, and/or the like. In this regard, these components often generate substantial heat. However the low thermal conductivity substrates provide limited removal of the heat generated by the components.

Attempts have been made to include an aluminum nitride (AlN) thermal conductor as part of the transistor package to improve removal of the heat generated by the components. However, AlN provides only limited thermal conductivity and accordingly components of the transistor package still typically experience substantial temperature levels.

Accordingly, what is needed are components to improve heat removal in components, transistor packages, and/or the like and processes of implementing the same.

SUMMARY OF THE DISCLOSURE

In one aspect, the component includes a substrate board. The component in addition includes a thermal bridge structured and arranged on the substrate board. The component moreover includes where the thermal bridge is configured to transfer heat from the substrate board including an area adjacent to or on a hotspot of the substrate board. The component also includes where the thermal bridge is configured to transfer the heat to another location on the substrate board for removal of the heat from the substrate board. The component further includes where the thermal bridge include silicon carbide.

In one aspect, the process includes providing a substrate board. The process in addition includes arranging a thermal bridge on the substrate board. The process moreover includes where the thermal bridge is configured to transfer heat from the substrate board including an area adjacent to or on a hotspot of the substrate board. The process also includes where the thermal bridge is configured to transfer the heat to another location on the substrate board for removal of the heat from the substrate board. The process further includes where the thermal bridge include silicon carbide.

Additional features, advantages, and aspects of the disclosure may be set forth or apparent from consideration of the following detailed description, drawings, and claims. Moreover, it is to be understood that both the foregoing summary of the disclosure and the following detailed description are exemplary and intended to provide further explanation without limiting the scope of the disclosure as claimed.

BRIEF DESCRIPTION OF THE DRAWINGS

The accompanying drawings, which are included to provide a further understanding of the disclosure, are incorporated in and constitute a part of this specification, illustrate aspects of the disclosure and together with the detailed description serve to explain the principles of the disclosure. No attempt is made to show structural details of the disclosure in more detail than may be necessary for a fundamental understanding of the disclosure and the various ways in which it may be practiced. In the drawings.

DETAILED DESCRIPTION OF THE DISCLOSURE

Figure 1:
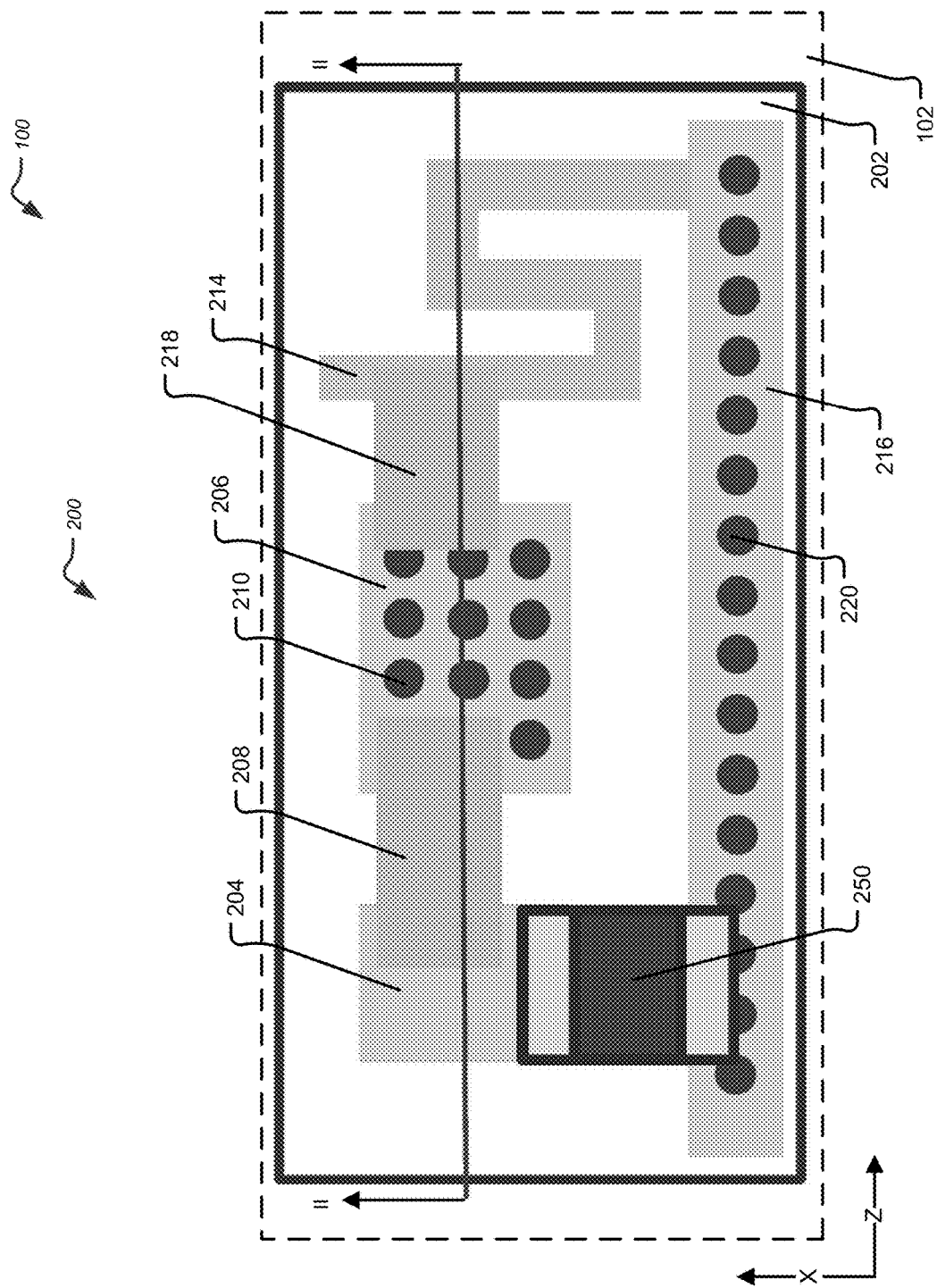
FIG. 1 illustrates a top view of a component implemented in a package according to aspects of the disclosure.

The aspects of the disclosure and the various features and advantageous details thereof are explained more fully with reference to the non-limiting aspects and examples that are described and/or illustrated in the accompanying drawings and detailed in the following description. It should be noted that the features illustrated in the drawings are not necessarily drawn to scale, and features of one aspect may be employed with other aspects, as the skilled artisan would recognize, even if not explicitly stated herein. Descriptions of well-known components and processing techniques may be omitted so as not to unnecessarily obscure the aspects of the disclosure. The examples used herein are intended merely to facilitate an understanding of ways in which the disclosure may be practiced and to further enable those of skill in the art to practice the aspects of the disclosure. Accordingly, the examples and aspects herein should not be construed as limiting the scope of the disclosure, which is defined solely by the appended claims and applicable law. Moreover, it is noted that like reference numerals represent similar parts throughout the several views of the drawings and in the different embodiments disclosed.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto another element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over another element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to another element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular aspects only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

In current devices, AlN may be used as a thermal conductor. However, as previously noted, AlN provides only limited performance as a thermal conductor.

In aspects, the disclosure is directed to a component which has high thermal conductivity (TC) with non-electrical conductivity, assembled on low thermal conductivity board material, between a hot spot and a ground connection for bridging the high thermal gradient points with minimal electric performance degradation. In PCB-based IPD (Integrated Passive Device) or an in-package integrated circuit for mMIMO (massive multiple input multiple output) applications, PCB board is commonly used as a substrate, however its low thermal conductivity has limited heat conduction or dissipation resulting in high temperature, which could exceed the component rating, result in component failure, solder joint failure, and/or the like. This is especially a problem where a signal trace is not connected to ground or grounding vias.

In aspects, the disclosure is directed to a non-electrically-conductive high thermal conductivity thermal jumper or bridge that can be used to transfer the heat from a hot spot to ground. In this disclosure, the thermal bridge is implemented using a silicon carbide (SiC) high thermal conductivity substrate. In aspects, the thermal bridge may be further integrated with a resistor and/or a wire bonding pad to further utilize the thermal bridge as a circuit component, for example, for baseband impedance suppression.

Aspects of the disclosure may utilize a SiC substrate material as a thermal bridge. Further aspects of the disclosure may utilize a SiC substrate material thermal bridge with vertical integration, which may include an integrated resistor, an electrical connection for IPD (Integrated Passive Device) applications, an electrical connection for mMIMO (massive Multiple-Input and Multiple-Output) applications, and/or the like.

In this regard, aspects of the disclosure implement SiC materials, which have a higher thermal conductivity in comparison to AlN materials. In particular, SiC materials for implementation of thermal bridges.

Further, aspects of the disclosure may implement SiC thermal bridges with at least one electrical connection to a baseband termination component that enables a circuit configuration that can overcome the high temperature rise as well as wideband baseband termination in a compact form.

FIG. 1 illustrates a top view of a component implemented in a package according to aspects of the disclosure.

Figure 2:
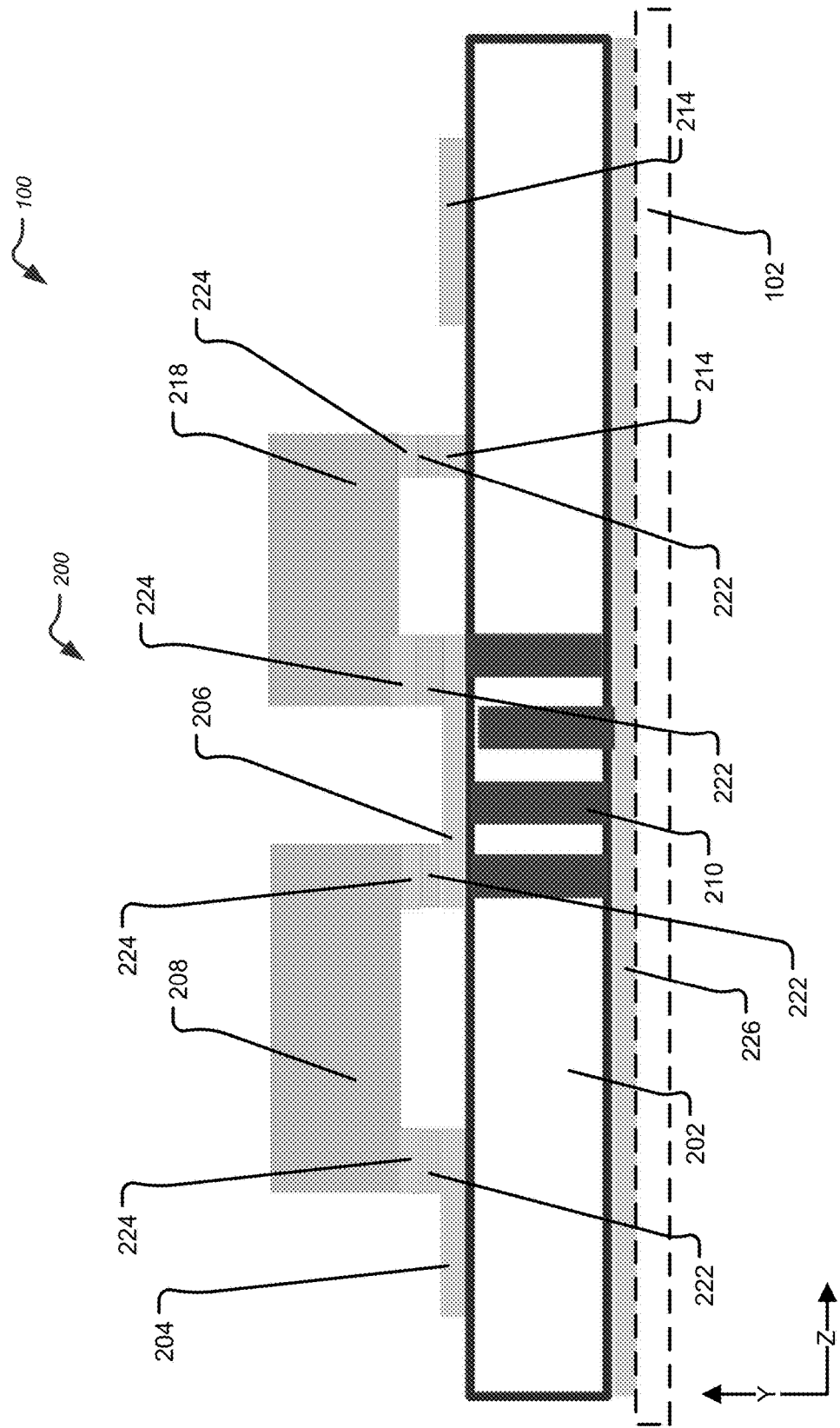
FIG. 2 illustrates a cross-sectional view of the component of FIG. 1 along lines II-II.

FIG. 2 illustrates a cross-sectional view of the component of FIG. 1 along lines II-II.

The aspects of FIG. 1 and FIG. 2 may include any one or more features as described herein. In particular, FIG. 1 and FIG. 2 show an exemplary implementation of a component 200 that may be implemented as part of a package 100 that may include any one or more other features, components, arrangements, and the like as described herein.

With reference to FIG. 1, in aspects the component 200 may include a substrate board 202, a thermal bridge 208, and/or the like. The thermal bridge 208 may be structured and arranged on the substrate board 202; and the thermal bridge 208 may be configured to transfer, spread, remove, and/or the like heat from the substrate board 202 including an area adjacent to or on a hotspot of the substrate board 202. Further, the thermal bridge 208 may be configured to transfer the heat to another location on the substrate board 202 for removal of the heat from the substrate board 202.

In aspects, the substrate board 202 may be implemented as a PCB (printed circuit board) or other material which has a lower thermal conductivity. In aspects, the substrate board 202 may be implemented with a material which has a lower thermal conductivity in comparison to the material of the thermal bridge 208. In aspects, the thermal bridge 208 may be implemented with a material which has a higher thermal conductivity in comparison to AlN. In particular aspects, the thermal bridge 208 is made of or includes SiC.

In aspects, the thermal bridge 208 may be attached to and/or integrated into any surface of the substrate board 202. In aspects, the thermal bridge 208 may be attached to the surface of the substrate board 202 by an adhesive, soldering, sintering, eutectic bonding, ultrasonically welding, and/or the like. Additionally, in aspects the thermal bridge 208 may be implemented with non-electrical conductivity. In other aspects, the thermal bridge 208 may be partially implemented with non-electrical conductivity. Accordingly, the thermal bridge 208 may be configured such that no electrical current flows through the thermal bridge 208. In other aspects, the thermal bridge 208 may be configured to allow limited electrical current flow.

In further aspects, the component 200 may include a first trace 204, a first grounded trace 206, at least one first via 210, a circuit component 250, a second grounded trace 216, at least one second via 220, and/or the like.

The thermal bridge 208 may be used on the substrate board 202 to transfer, spread, remove, and/or the like heat from the substrate board 202 including an area adjacent the first trace 204. In aspects of the component 200, a lead of the circuit component 250 may be located adjacent the first trace 204, which is away from the at least one second via 220 (grounding via) and may experience a high temperature rise. In particular, the circuit component 250 may generate heat including heat adjacent the first trace 204.

In aspects, the thermal bridge 208 has high thermal conductivity (TC) with non-electrical conductivity, assembled on the substrate board 202, which is a low thermal conductivity board material, between a hot spot, such as the circuit component 250 and a ground connection, such as the first grounded trace 206 and/or the at least one first via 210 for bridging the high thermal gradient points in the component 200 with minimal electric performance degradation of the component 200.

In aspects, the thermal bridge 208 may be a thermal jumper, a non-electrically-conductive high thermal conductivity thermal jumper, a non-electrically-conductive high thermal conductivity thermal bridge, a component, a non-electrically-conductive component, an electrically inactive component, a structure, a non-electrically-conductive structure, an electrically inactive structure, and/or the like configured to transfer heat from the component 200 to another location, to transfer heat from the component 200 to ground, and/or the like. In aspects, the thermal bridge 208 may be configured and/or used to transfer the heat from a hot spot in the component 200, such as the first trace 204 and/or the circuit component 250 to ground, such as the first grounded trace 206 and/or the at least one first via 210. In aspects, the thermal bridge 208 may be implemented using a silicon carbide (SiC) high thermal conductivity substrate.

The thermal bridge 208 may connect to two points on the substrate board 202. For example, the thermal bridge 208 may connect to the first trace 204 and the first grounded trace 206. Without the disclosed features, the first trace 204 may be at a higher temperature due to insufficient heat transfer, such as connection to grounding vias, a longer distance to the grounding vias, and/or the like. According to aspects of the disclosure, the component 200 may implement the thermal bridge 208 to conduct the heat from the high temperature side of the circuit component 250 and/or the first trace 204 to the at least one first via 210 of the first grounded trace 206.

With reference to FIG. 2, in aspects the component 200 may include an attach material 222, a bottom metal 224, a bottom metal 226, and/or the like. The package 100 may include a support 102 and the component 200 may be arranged on the support 102 of the package 100.

In particular, the thermal bridge 208 may include silicon carbide (SiC). The thermal bridge 208 may be made of SiC. In some aspects, the thermal bridge 208 may be an electrically inactive SiC substrate, an insulating SiC substrate, a semi-insulating substrate, a p-type substrate, an n-type substrate, and/or the like. In some aspects, the thermal bridge 208 may be very lightly doped. In one aspect, the thermal bridge 208 may be formed of SiC selected from the group of 6H, 4H, 15R, 3C SiC, or the like. In one aspect, the thermal bridge 208 may be formed of SiC that may be semi-insulating and doped with vanadium or any other suitable dopant or undoped of high purity with defects providing the semi-insulating properties. In aspects, the thermal bridge 208 may comprise a semi-insulating SiC substrate, a semi-insulating 4H SiC substrate, a high purity semi-insulating 4H SiC substrate, a high purity semi-insulating 4H SiC substrate having resistivity sufficient to be non-electrically conductive, and/or the like. In aspects, the thermal bridge 208 may have a thickness along the y-axis as illustrated in FIG. 2 of 50 to 500 µm, 50 to 75 µm, 75 to 125 µm, 90 to 110 µm, 125 to 200 µm, 200 to 300 µm, 300 to 400 µm, 325 to 375 µm, or 400 to 500 µm.

The thermal bridge 208 may include the bottom metal 224. In particular aspects, the thermal bridge 208 may include the bottom metal 224 arranged on a bottom surface of the thermal bridge 208 adjacent a top surface of the substrate board 202. In particular aspects, the thermal bridge 208 may include the bottom metal 224 arranged at locations adjacent the first trace 204 and/or the at least one first via 210.

The first trace 204 may be arranged on a top surface of the substrate board 202 adjacent the thermal bridge 208. The first trace 204 may comprise a metallic material such as copper, gold, nickel, palladium, silver, and the like, and combinations thereof. The first trace 204 may be located in a plane generally parallel or parallel to the x-axis and/or the z-axis or a plane generally parallel to an upper surface of the substrate board 202.

In aspects, the bottom metal 224 may be configured to transfer heat to and from the thermal bridge 208. The bottom metal 224 may comprise a metallic material such as copper, gold, nickel, palladium, silver, and the like, and combinations thereof. The bottom metal 224 may be located in a plane generally parallel or parallel to the x-axis and/or the z-axis or a plane generally parallel to the upper surface of the substrate board 202.

In aspects, the substrate board 202 may include the bottom metal 226. The bottom metal 226 may be configured to transfer heat to and from the at least one first via 210; and the bottom metal 226 may be configured to transfer heat to and from the support 102. The bottom metal 226 may be arranged on a bottom surface of the substrate board 202 opposite the top surface of the substrate board 202. The bottom metal 226 may comprise a metallic material such as copper, gold, nickel, palladium, silver, and the like, and combinations thereof. The bottom metal 226 may be located in a plane generally parallel or parallel to the x-axis and/or the z-axis or a plane generally parallel to the upper surface of the support 102.

Additionally, the component 200 may include the attach material 222 arranged between the bottom metal 224 of the thermal bridge 208 and the first trace 204; and/or the component 200 may include the attach material 222 arranged between the bottom metal 224 of the thermal bridge 208 and the first grounded trace 206. In aspects, the attach material 222 may include implementations of adhesive, soldering, sintering, eutectic bonding, ultrasonically welding, and/or the like as described herein. In aspects, the attach material 222 may be configured to transfer heat to and from the thermal bridge 208.

The circuit component 250 may generate heat during operation of the package 100 and/or the component 200. In this regard, the circuit component 250 may operate with parasitic inductance, resistance, Equivalent Series Resistance (ESR), and/or the like that results in generation of heat. In this regard, the heat generated by the circuit component 250 may be transferred from one end of the circuit component 250 to the second grounded trace 216. Thereafter, heat may be transferred from the second grounded trace 216 to the at least one second via 220; heat may be transferred from the at least one second via 220 to the bottom metal 226; and heat may be transferred from the bottom metal 226 to the support 102.

Additionally, the heat generated by the circuit component 250 may be transferred from another end of the circuit component 250 to the thermal bridge 208. Thereafter, heat may be transferred from the thermal bridge 208 to the first grounded trace 206; heat may be transferred from the first grounded trace 206 to the at least one first via 210; heat may be transferred from the at least one first via 210 to the bottom metal 226; and heat may be transferred from the bottom metal 226 to the support 102.

In this regard, the circuit component 250 may be an SMD (surface mounted device), an SMD capacitor, a capacitor, and/or the like. In aspects, the circuit component 250 may be a component that has Equivalent Series Resistance (ESR) that can contribute to a temperature rise with high current flowing therethrough. The circuit component 250 may be mounted on the second grounded trace 216 and/or the first trace 204 by an adhesive, soldering, sintering, eutectic bonding, ultrasonically welding, and/or the like as described herein. In aspects, the circuit component 250 may be mounted directly or indirectly to the top surface of the substrate board 202.

In aspects, the component 200 may optionally include a second trace 214, a thermal bridge 218, and/or the like. In this aspect, the component 200 may optionally not include the thermal bridge 208. In other aspects, the component 200 may optionally implement both the thermal bridge 208 and the thermal bridge 218. In aspects, the component 200 may implement any number of the thermal bridge 208; and the component 200 may implement any number of the thermal bridge 218.

In aspects, the thermal bridge 218 may be implemented with the same construction as the thermal bridge 208. In other aspects, the thermal bridge 218 may be implemented with a different construction than the thermal bridge 208.

In further aspects, the thermal bridge 218 may include silicon carbide (SiC). The thermal bridge 218 may be made of SiC. In some aspects, the thermal bridge 218 may be an insulating SiC substrate, a p-type substrate, an n-type substrate, and/or the like. In some aspects, the thermal bridge 218 may be very lightly doped. In one aspect, the thermal bridge 218 may be formed of SiC selected from the group of 6H, 4H, 15R, 3C SiC, or the like. In one aspect, the thermal bridge 218 may be formed of SiC that may be semi-insulating and doped with vanadium or any other suitable dopant or undoped of high purity with defects providing the semi-insulating properties.

The thermal bridge 218 may include the bottom metal 224. In particular, the thermal bridge 218 may include the bottom metal 224 arranged at locations adjacent the first grounded trace 206 and/or the at least one first via 210; and the thermal bridge 218 may include the bottom metal 224 arranged at locations adjacent the second trace 214. The second trace 214 may be a feature of the component 200 that generates heat.

In one aspect, the second trace 214 may be configured as an inductor and may comprise a metallic material such as copper, gold, nickel, palladium, silver, and the like, and combinations thereof. In one aspect, the second trace 214 may operate with parasitic inductance, resistance, Equivalent Series Resistance (ESR), and/or the like that results in generation of heat. The second trace 214 may be located in a plane generally parallel or parallel to the x-axis and/or the z-axis or a plane generally parallel to the upper surface of the substrate board 202.

Additionally, the component 200 may include the attach material 222 arranged between the bottom metal 224 of the thermal bridge 218 and the second trace 214; and the component 200 may include the attach material 222 arranged between the bottom metal 224 of the thermal bridge 218 and the at least one first via 210 and/or the first grounded trace 206. In aspects, the attach material 222 may include implementations of adhesive, soldering, sintering, eutectic bonding, ultrasonically welding, and/or the like as described herein.

The second trace 214 may generate heat during operation of the package 100 and/or the component 200. In this regard, the heat generated by the second trace 214 may be transferred from one end of the second trace 214 to the second grounded trace 216. Thereafter, heat may be transferred from the second grounded trace 216 to the at least one second via 220; heat may be transferred from the at least one second via 220 to the bottom metal 226; and heat may be transferred from the bottom metal 226 to the support 102.

Additionally, the heat generated by the second trace 214 may be transferred from another end of the second trace 214 to the thermal bridge 218. Thereafter, heat may be transferred from the thermal bridge 218 to the first grounded trace 206; heat may be transferred from the first grounded trace 206 to the at least one first via 210; heat may be transferred from the at least one first via 210 to the bottom metal 226; and heat may be transferred from the bottom metal 226 to the support 102.

The at least one first via 210 and/or the at least one second via 220 may comprise a metallic material such as copper, gold, nickel, palladium, silver, and the like, and combinations thereof. The at least one first via 210 and/or the at least one second via 220 may have an axis that may be located in a plane generally perpendicular to the x-axis and/or the z-axis, a plane generally parallel to the y-axis, and/or a plane generally perpendicular to an upper surface of the substrate board 202.

In aspects, a material of the thermal bridge 208 and/or the thermal bridge 218 may be anisotropic with respect to heat flow. In other words, a material of the thermal bridge 208 and/or the thermal bridge 218 may conduct heat better along a particular axis of the material. Accordingly, implementations of the thermal bridge 208 and/or the thermal bridge 218 may be structured and arranged such that the particular axis that better conducts heat is located parallel to a desired axis of heat flow through the thermal bridge 208 and/or the thermal bridge 218 to take advantage of improved heat flow through the thermal bridge 208 and/or the thermal bridge 218. In aspects, implementations of the thermal bridge 208 and/or the thermal bridge 218 may be structured and arranged such that the particular axis that better conducts heat is located parallel to an upper surface of the substrate board 202.

In aspects of the component 200, the various components of the component 200 may have thermal expansion properties. Accordingly, the various components of the component 200 may be configured to have matching thermal expansion. In particular aspects, the thermal bridge 208 and/or the thermal bridge 218 may be configured to have matching thermal expansion to the various components of the component 200. In particular aspects, the thermal bridge 208 and/or the thermal bridge 218 may be configured to have matching thermal expansion to the various components of the substrate board 202.

Figure 3:
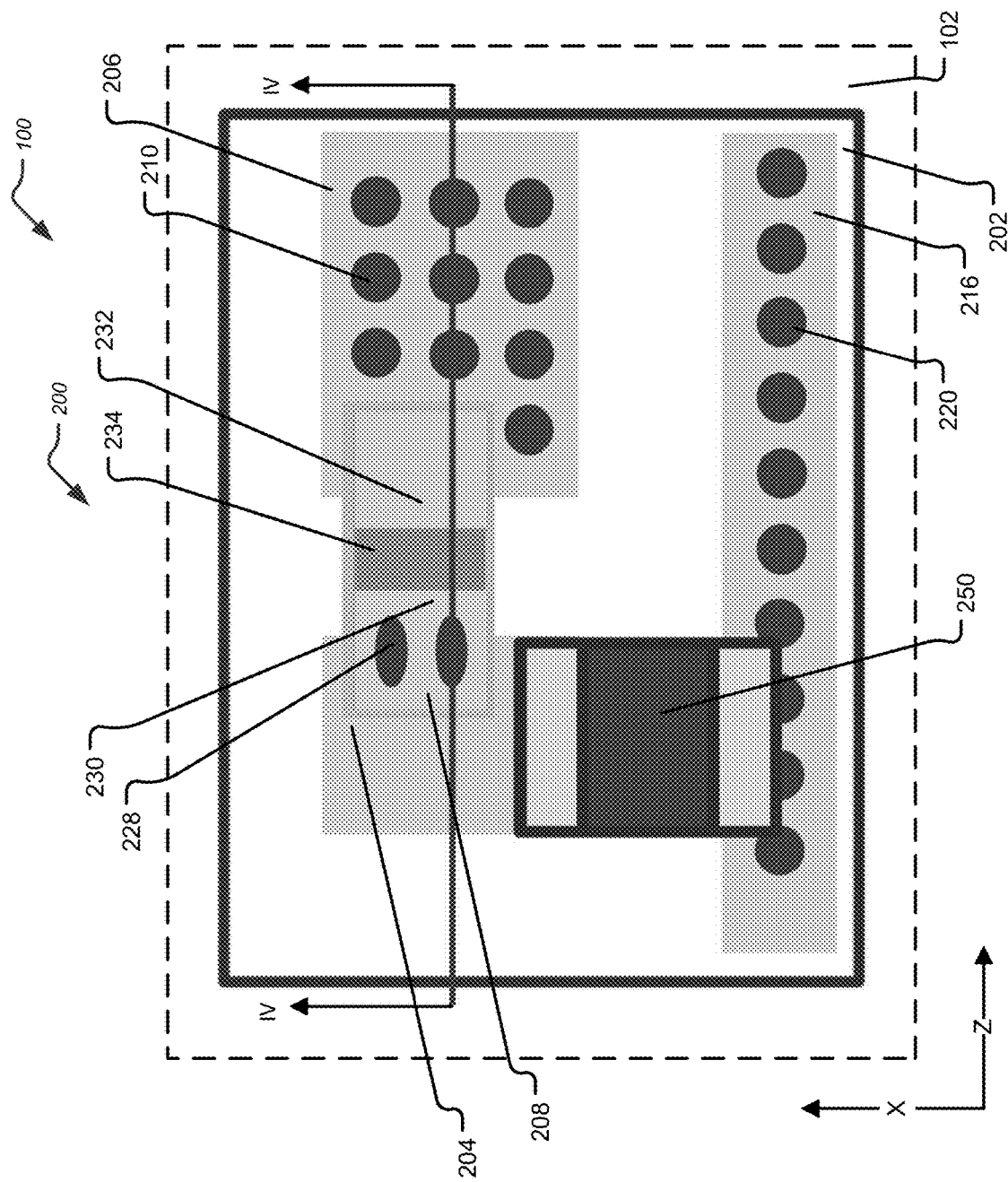
FIG. 3 illustrates a top view of a component implemented in a package according to aspects of the disclosure.

FIG. 3 illustrates a top view of a component implemented in a package according to aspects of the disclosure.

Figure 4:
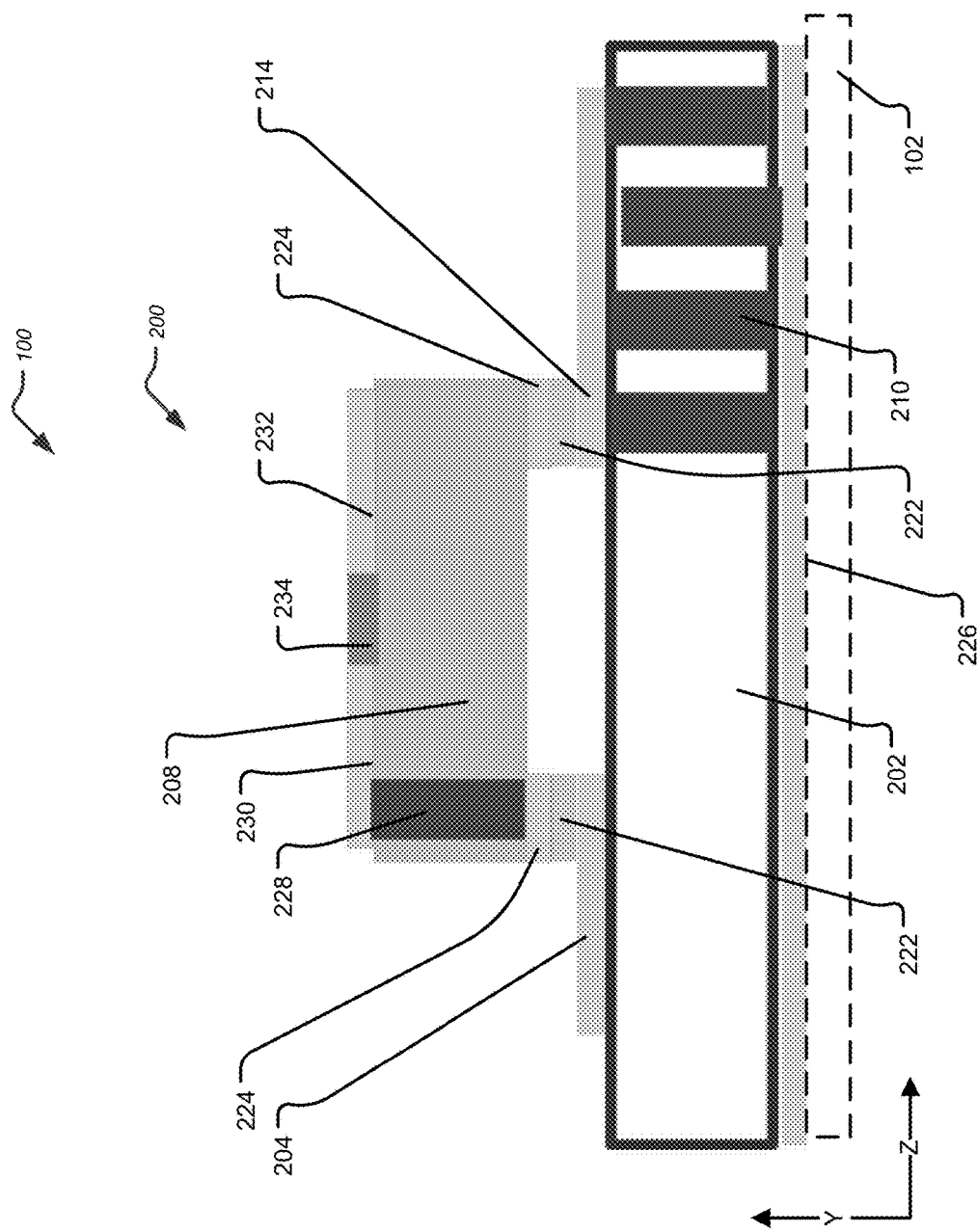
FIG. 4 illustrates a cross-sectional view the component of FIG. 3 along lines IV-IV.

FIG. 4 illustrates a cross-sectional view the component of FIG. 3 along lines IV-IV.

The aspects of FIG. 3 and FIG. 4 may include any one or more features as described herein. In particular, FIG. 3 and FIG. 4 show an exemplary implementation of the component 200 implementing the thermal bridge 208 that may be implemented as part of the package 100 that may include any one or more other features, components, arrangements, and the like as described herein.

In particular, the thermal bridge 208 implemented in the component 200 of FIG. 3 and FIG. 4 may include all the aspects as described with respect to FIG. 1 and FIG. 2. Further, the thermal bridge 208 may include at least one via 228, a first top metal 230, a second top metal 232, and a resistor 234.

In particular, the thermal bridge 208 illustrated in FIG. 3 and FIG. 4 may be configured as an integrated thermal bridge with the at least one via 228 and the first top metal 230 configured for electrical connectivity with an integrated implementation of the resistor 234. More specifically, the thermal bridge 208 may have the at least one via 228 configured for connecting from the bottom metal 224 to the first top metal 230. Additionally, the thermal bridge 208 may also have an integrated implementation of the resistor 234 on the top of the thermal bridge 208 between the first top metal 230 and the second top metal 232. Further, the second top metal 232 may be configured as a wire bonding pad to connect the second top metal 232 to another component, such as another component of the package 100. In aspects, the first trace 204 may be electrically connected to the at least one via 228, the first top metal 230, the resistor 234, and the second top metal 232.

The first top metal 230 may be arranged on an upper surface of the thermal bridge 208, which may be a surface opposite the substrate board 202. The first top metal 230 may comprise a metallic material such as copper, gold, nickel, palladium, silver, and the like, and combinations thereof. The first top metal 230 may be located in a plane generally parallel or parallel to the x-axis and/or the z-axis or a plane generally parallel to the upper surface of the substrate board 202.

The resistor 234 may be arranged on an upper surface of the thermal bridge 208, which may be a surface opposite the substrate board 202. The resistor 234 may include a resistor material arranged on the thermal bridge 208 between and electrically connected to the first top metal 230 and the second top metal 232. The resistor 234 may be implemented as a bulk resistor. The bulk resistor implementation of the resistor 234 may include a bulk resistor material arranged on the thermal bridge 208. In particular aspects, the bulk resistor implementation of the resistor 234 may include a bulk resistor material arranged on the thermal bridge 208 between and electrically connected to the first top metal 230 and the second top metal 232.

The second top metal 232 may be arranged on an upper surface of the thermal bridge 208, which may be a surface opposite the substrate board 202. The second top metal 232 may comprise a metallic material such as copper, gold, nickel, palladium, silver, and the like, and combinations thereof. The second top metal 232 may be located in a plane generally parallel or parallel to the x-axis and/or the z-axis or a plane generally parallel to the upper surface of the substrate board 202.

Figure 5:
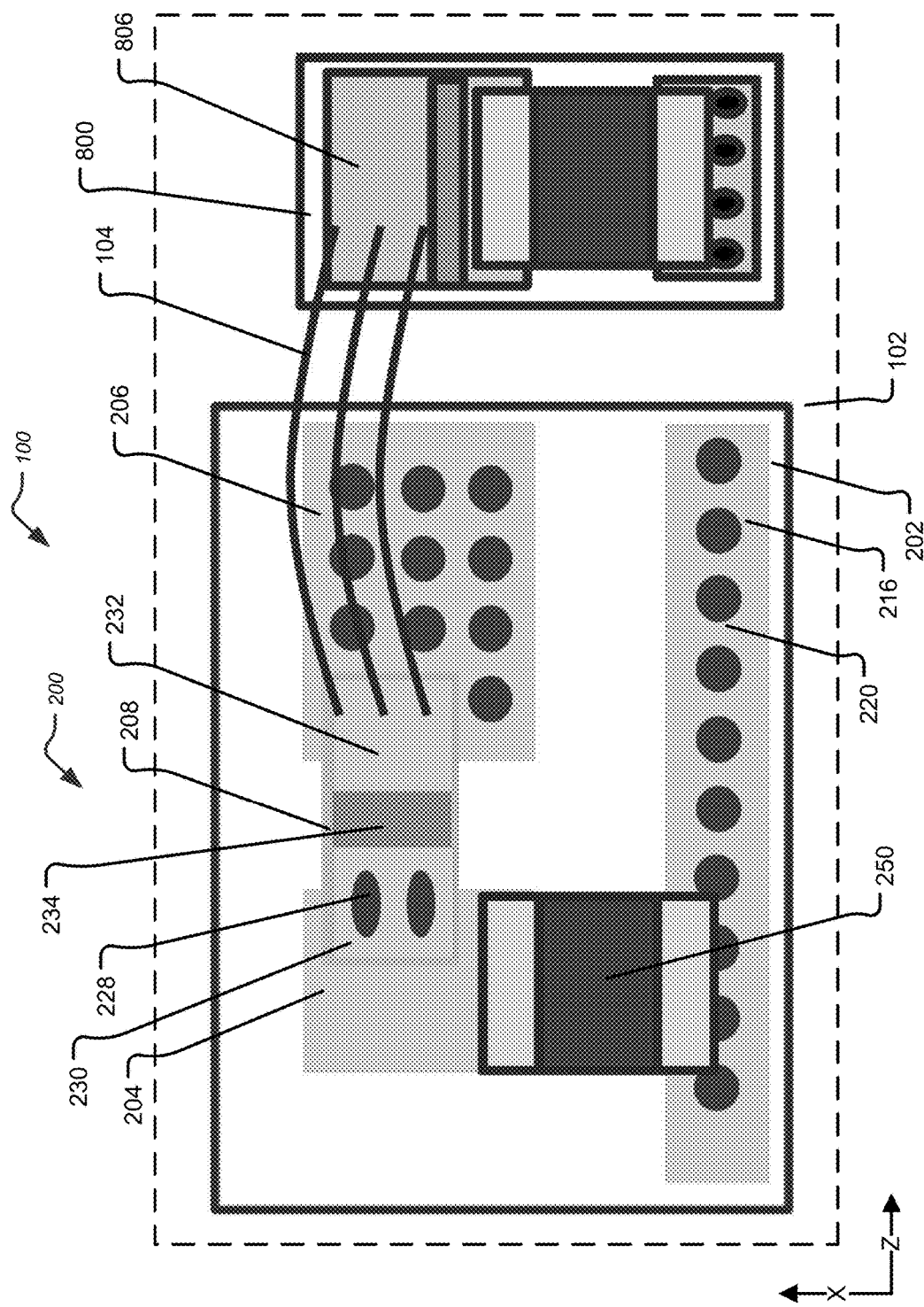
FIG. 5 illustrates a top view of a component implemented in a package according to aspects of the disclosure.

FIG. 5 illustrates a top view of a component implemented in a package according to aspects of the disclosure.

The aspects of FIG. 5 may include any one or more features as described herein. In particular, FIG. 5 shows an exemplary implementation of the component 200 implementing the thermal bridge 208 that may be implemented as part of the package 100 that may include any one or more other features, components, arrangements, and the like as described herein.

In particular, FIG. 5 illustrates of embodiment of the component 200 where the thermal bridge 208 may be configured to connect to an IPD component 800 (integrated passive device). In aspects, the IPD component 800 may be configured as a baseband termination PCB-IPD. In aspects, the thermal bridge 208 may be configured to connect the baseband termination PCB based IPD through the resistor 234.

In particular aspects, the second top metal 232 may be configured as a bonding pad for bonding to one or more interconnects 104. Further, the one or more interconnects 104 may extend from the second top metal 232 of the thermal bridge 208 to an interconnect pad 806 of the IPD component 800.

The one or more interconnects 104 may utilize ball bonding, wedge bonding, compliant bonding, ribbon bonding, metal clip attach, and/or the like. In one aspect, the one or more interconnects 104 may utilize the same type of connection. In one aspect, the one or more interconnects 104 may utilize different types of connections.

Figure 6:
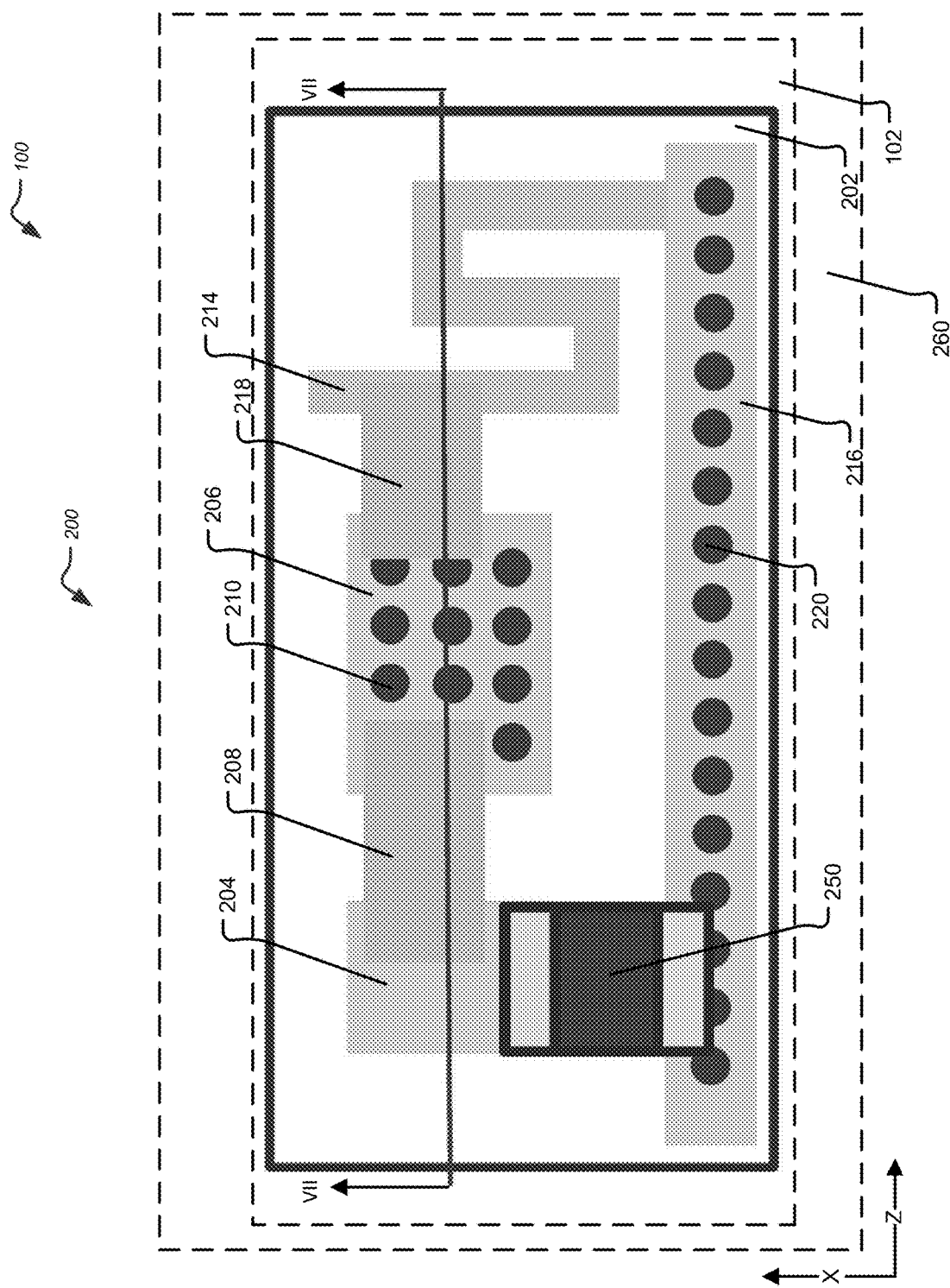
FIG. 6 illustrates a top view of a component implemented in a package according to aspects of the disclosure.

FIG. 6 illustrates a top view of a component implemented in a package according to aspects of the disclosure.

Figure 7:
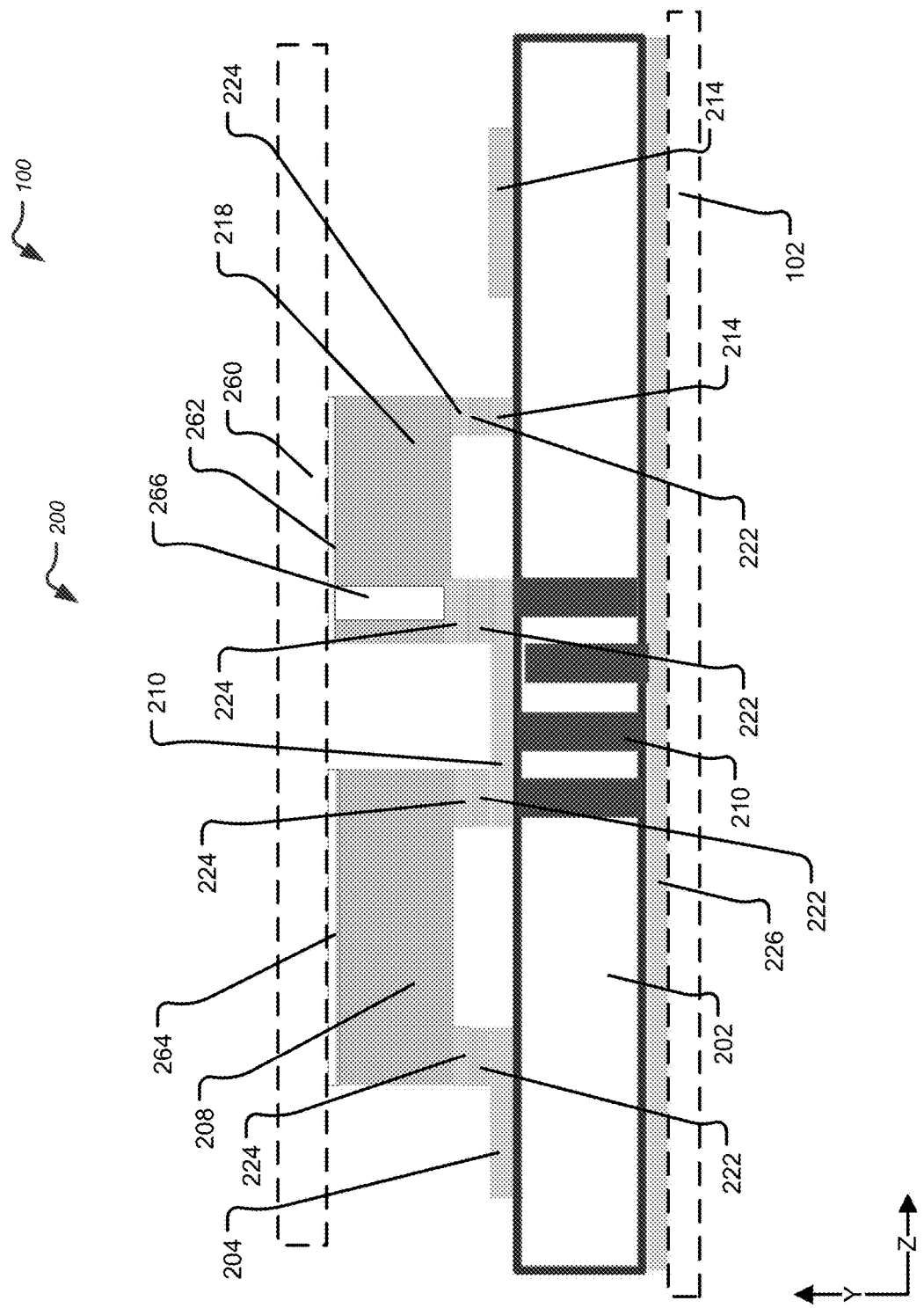
FIG. 7 illustrates a cross-sectional view the component of FIG. 6 along lines VII-VII.

FIG. 7 illustrates a cross-sectional view the component of FIG. 6 along lines VII-VII.

The aspects of FIG. 6 and FIG. 7 may include any one or more features as described herein. In particular, FIG. 6 and FIG. 7 show an exemplary implementation of the component 200 implementing the thermal bridge 208 and/or the thermal bridge 218 that may be implemented as part of the package 100 that may include any one or more other features, components, arrangements, and the like as described herein.

In particular, FIG. 6 and FIG. 7 illustrates the component 200 configured with a topside heat sink 260. With reference to FIG. 7, the topside heat sink 260 may be arranged above and connected to the thermal bridge 208 and/or the thermal bridge 218. In aspects, the component 200 is configured as a flip chip.

In particular aspects, FIG. 6 and FIG. 7 illustrates an implementation of the component 200 configured so that the thermal bridge 208 and/or the thermal bridge 218 may be configured as a mechanical support for the topside heat sink 260. In this regard, the thermal bridge 208 and/or the thermal bridge 218 may be structured and arranged such that the heat may flow from a hot spot of the substrate board 202, such as the circuit component 250 and/or the second trace 214 to the thermal bridge 208 and/or the thermal bridge 218. Thereafter, heat may flow from the thermal bridge 208 and/or the thermal bridge 218 to the topside heat sink 260. In this regard, the thermal bridge 208 and/or the thermal bridge 218 may be configured to provide mechanical support for the topside heat sink 260.

In aspects, the thermal bridge 218 may include a top metal layer 262. The top metal layer 262 may be arranged on an upper surface of the thermal bridge 218 opposite the substrate board 202. The top metal layer 262 may comprise a metallic material such as copper, gold, nickel, palladium, silver, and the like, and combinations thereof. The thermal bridge 218 may be located in a plane generally parallel or parallel to the x-axis and/or the z-axis or a plane generally parallel to the upper surface of the support 102.

In aspects, the thermal bridge 208 may include a top metal layer 264. The top metal layer 264 may be arranged on an upper surface of the thermal bridge 218 opposite the substrate board 202. The top metal layer 264 may comprise a metallic material such as copper, gold, nickel, palladium, silver, and the like, and combinations thereof. The top metal layer 264 may be located in a plane generally parallel or parallel to the x-axis and/or the z-axis or a plane generally parallel to the upper surface of the support 102.

In aspects, the thermal bridge 218 may include at least one via 266. In aspects, the at least one via 266 may be implemented as an electrical ground to the topside heat sink 260. Accordingly, current may flow from the at least one first via 210 through the at least one via 266 to the first grounded trace 206. In other aspects, the top metal layer 262 may provide a path for greater heat flow through the thermal bridge 218. In this regard, the thermal bridge 218 may be anisotropic with respect to heat flow. Accordingly, an axis where the thermal bridge 218 is arranged may not conduct heat as well and the at least one via 266 may increase heat flow along this axis.

The at least one via 266 may comprise a metallic material such as copper, gold, nickel, palladium, silver, and the like, and combinations thereof. The at least one via 266 may have an axis that may be located in a plane generally perpendicular to the x-axis and/or the z-axis, a plane generally parallel to the y-axis, and/or a plane generally perpendicular to an upper surface of the substrate board 202.

Figure 8:
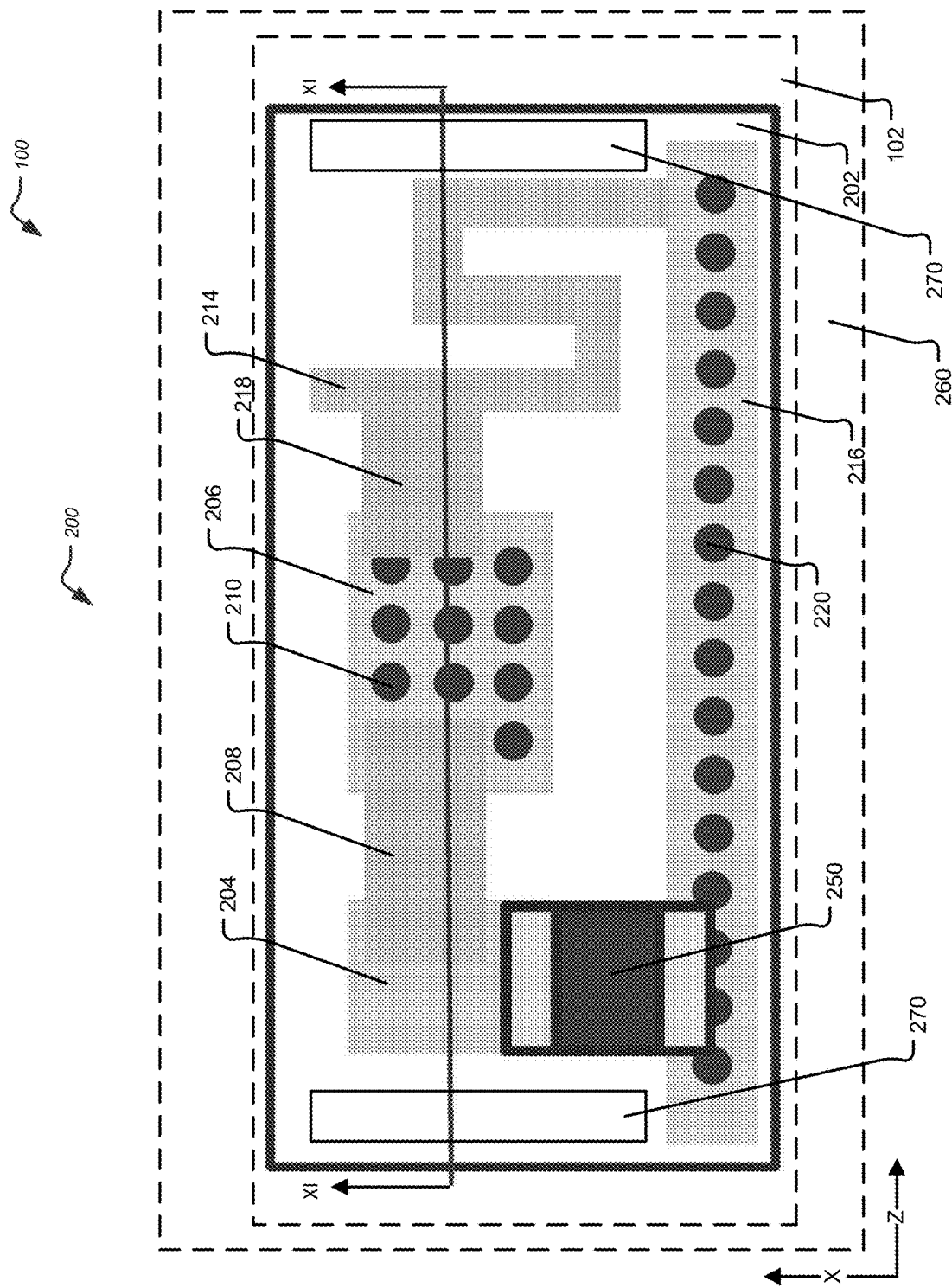
FIG. 8 illustrates a top view of a component implemented in a package according to aspects of the disclosure.

FIG. 8 illustrates a top view of a component implemented in a package according to aspects of the disclosure.

Figure 9:
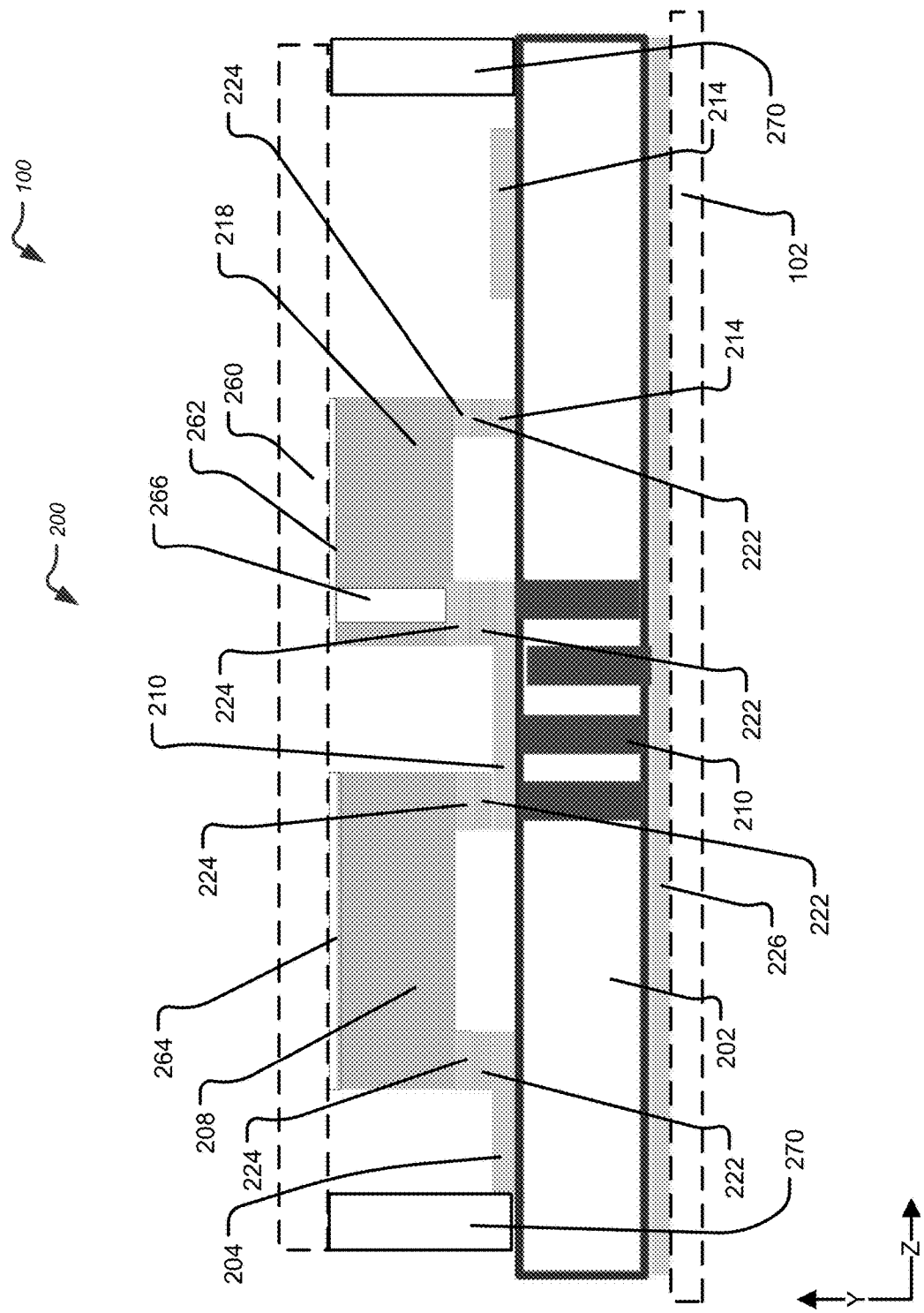
FIG. 9 illustrates a cross-sectional view the component of FIG. 9 along lines XI-XI.

FIG. 9 illustrates a cross-sectional view the component of FIG. 9 along lines XI-XI.

The aspects of FIG. 8 and FIG. 9 may include any one or more features as described herein. In particular, FIG. 8 and FIG. 9 show an exemplary implementation of the component 200 implementing the thermal bridge 208 and/or the thermal bridge 218 that may be implemented as part of the package 100 that may include any one or more other features, components, arrangements, and the like as described herein.

In particular, the component 200 may include support stands 270. The support stands 270 may be arranged on edges of the substrate board 202 with the thermal bridge 208 and/or the thermal bridge 218 arranged therebetween. The support stands 270 may support the topside heat sink 260 and may transfer heat from the substrate board 202 to the topside heat sink 260. In particular, the support stands 270 may provide further mechanical support for the topside heat sink 260.

In particular aspects, the support stands 270 may be attached to an upper surface of the substrate board 202 with adhesive, soldering, sintering, eutectic bonding, ultrasonically welding, and/or the like as described herein. In particular aspects, the support stands 270 may be directly attached to an upper surface of the substrate board 202. In particular aspects, the support stands 270 may be indirectly attached to an upper surface of the substrate board 202 with one or more intervening components including metal surfaces.

Further, the support stands 270 may be attached to a lower surface of the topside heat sink 260 with adhesive, soldering, sintering, eutectic bonding, ultrasonically welding, and/or the like as described herein. In particular aspects, the support stands 270 may be directly attached to a lower surface of the topside heat sink 260. In particular aspects, the support stands 270 may be indirectly attached to a lower surface of the topside heat sink 260 with one or more intervening components including metal surfaces.

Figure 10:
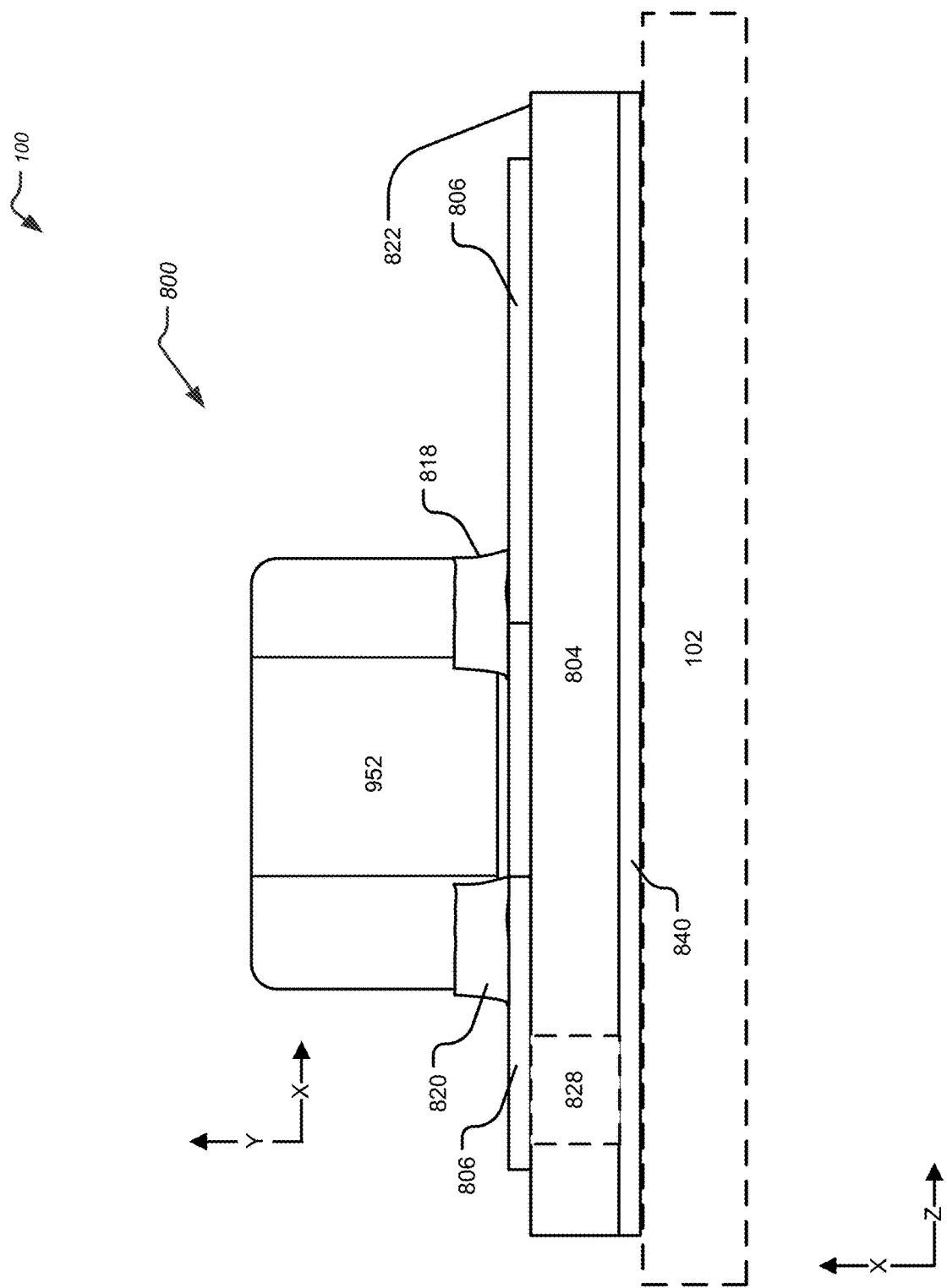
FIG. 10 illustrates a partial side view of the IPD component according to aspects of the disclosure.

FIG. 10 illustrates a partial side view of the IPD component according to aspects of the disclosure.

Figure 11:
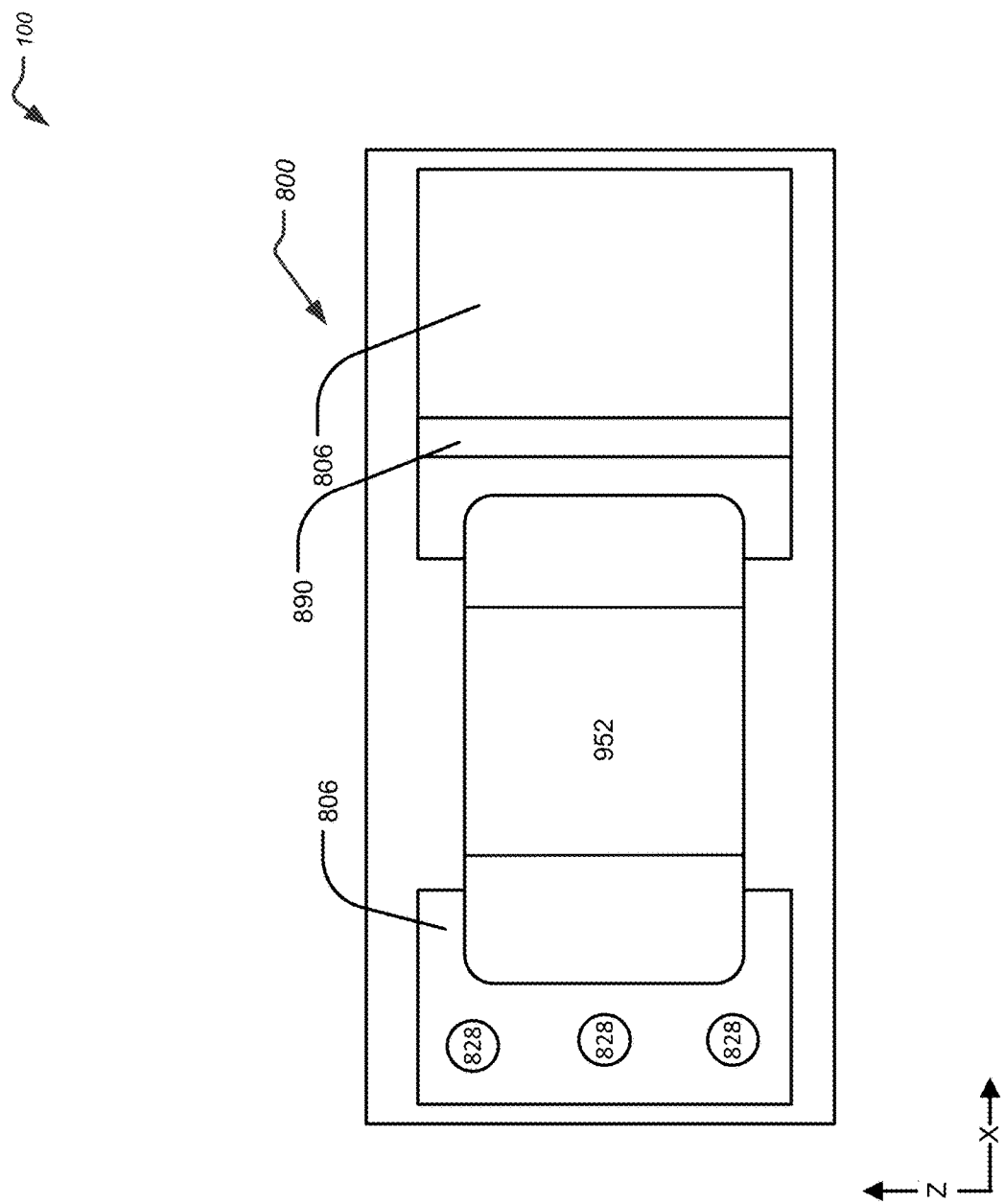
FIG. 11 illustrates a top view of the IPD component according to FIG. 10.

FIG. 11 illustrates a top view of the IPD component according to FIG. 10.

In particular, FIG. 10 and FIG. 11 illustrate exemplary implementations of the IPD component 800 that may include any one or more other features, components, arrangements, and the like as described herein. With reference to FIG. 10, the IPD component 800 may include a substrate 804, a capacitor 952, the interconnect pad 806, and/or the like.

The substrate 804 may include a printed circuit board, silicon carbide (SiC), silicon, Alumina, Aluminum Nitride (AlN), Beryllium oxide (BeO), Titanium Oxide (TiO), metal-oxide substrates, high dielectric metal-oxide substrates, high dielectric substrates, thermally conductive dielectric materials/substrates, a thermally conductive high dielectric material substrate, and/or other similar thermal conductivity performance dielectric material.

With reference to FIG. 10, the substrate 804 may include an upper surface 822. The upper surface 822 may be located in a plane generally parallel to the x-axis or a plane generally parallel to the upper surface of the support 102. In this regard, generally may be defined to be within 0°-15°, 0°-2°, 2°-4°, 4°-6°, 6°-8°, 8°-10°, 10°-12°, or 12°-15°. The upper surface 822 may support the interconnect pad 806. The interconnect pad 806 may include multiple bond pad areas. The interconnect pad 806 may be formed by a metal surface on the upper surface 822 of the substrate 804 and may comprise a metallic material such as copper, gold, nickel, palladium, silver, and the like, and combinations thereof.

In some aspects, the capacitor 952 may include terminals arranged on a bottom surface. Accordingly, directly mounting a device such as the capacitor 952 to the support 102 of the package 100 would result in a short. For example, the capacitor 952 implemented as a surface mount device (SMD) component, such as a surface mount device (SMD) ceramic capacitor, may include one or more terminals arranged on a bottom surface of the surface mount device (SMD) component. Accordingly, mounting the capacitor 952 configured as a surface mount device (SMD) component to the support 102 of the package 100 would result in a short.

Accordingly, the disclosure utilizes the substrate 804 of the IPD component 800 to support the capacitor 952. The substrate 804 may be mounted on an upper surface of the support 102. The substrate 804 may be mounted on the upper surface of the support 102 by an adhesive, soldering, sintering, eutectic bonding, ultrasonically welding, and/or the like as described herein. In one aspect, the substrate 804 may be directly mounted on the upper surface of the support 102. In one aspect, the substrate 804 may be mounted on the upper surface of the support 102 with intervening structures, components, and/or the like. The upper surface of the support 102 may be parallel to a z-axis; and the substrate 804 may be arranged vertically above the support 102 along a y-axis as illustrated in FIG. 10. In one aspect, the substrate 804 may be at least partially insulating. More specifically, the substrate 804 may at least partially insulate the capacitor 952 from the support 102.

In one aspect, the one or more of the interconnect pad 806 may be surfaces for bonding to the one or more interconnects 104. Accordingly, it may be beneficial to ensure that the surface of the interconnect pad 806 remain clean. In particular, attachment of the capacitor 952 to the interconnect pad 806 may result in solder transferring to other surfaces of the interconnect pad 806. Accordingly, the interconnect pad 806 may include a solder barrier 890 arranged between various bond areas of the one or more interconnects 104 to the interconnect pad 806 and the bond areas of the capacitor 952 to the interconnect pad 806.

The upper surface 822 may further implement the interconnect pad 806 as a first terminal bond pad. The first terminal bond pad may be located in a plane generally parallel to the x-axis or a plane generally parallel to the upper surface 822. The first terminal bond pad may connect to a first terminal of the capacitor 952. In this regard, a first connection 820 may be formed between the first terminal bond pad and the first terminal. The first connection 820 may include an adhesive, soldering, sintering, eutectic bonding, ultrasonically welding, and/or the like as described herein. The first terminal bond pad may be formed by a metal surface on the upper surface 822 of the substrate 804 and may comprise a metallic material such as copper, gold, nickel, palladium, silver, and the like, and combinations thereof.

The upper surface 822 may further implement another one of the interconnect pad 806 as a second terminal bond pad. The second terminal bond pad may be located in a plane generally parallel to the x-axis or a plane generally parallel to the upper surface 822. The second terminal bond pad may connect to a second terminal of the capacitor 952. In this regard, a second connection 818 may be formed between the second terminal bond pad and the second terminal. The second terminal bond pad may be electrically connected in part to the interconnect pad 806. The second connection 818 may include an adhesive, soldering, sintering, eutectic bonding, ultrasonically welding, and/or the like as described herein. The second terminal bond pad may be formed by a metal surface on the upper surface 822 of the substrate 804 and may comprise a metallic material such as copper, gold, nickel, palladium, silver, and the like, and combinations thereof. Additionally, the upper surface 822 of the substrate 804 may include additional terminals for the capacitor 952 as needed.

The IPD component 800 may include a metallization layer 840 located on a lower surface of the substrate 804 opposite the upper surface 822. The metallization layer 840 may be located in a plane generally parallel to the x-axis or a plane generally parallel to the upper surface 822. In one aspect, the metallization layer 840 may be implemented as a full face metallic layer on the lower surface of the substrate 804 opposite the upper surface 822.

Additionally, the IPD component 800 may include vias 828. The vias 828 may extend from the interconnect pad 806 to the metallization layer 840. Accordingly, a terminal of the capacitor 952 may connect through the first connection 820 to the first terminal bond pad through the vias 828 at least to the metallization layer 840 to make an electrical connection and/or electrical contact with the support 102. The vias 828 may also extend through the metallization layer 840 to the support 102 to make an electrical connection and/or electrical contact with the support 102. In other aspects, the vias 828 may only be implemented as partial vias. The vias 828 may be metallic plated holes or metallic filled holes that may function as electrical tunnels through the substrate 804. The vias 828 may comprise a metallic material such as copper, gold, nickel, palladium, silver, and the like, and combinations thereof. The vias 828 may have an axis that may be located in a plane generally perpendicular to the x-axis, a plane generally parallel to the z-axis, and/or a plane generally perpendicular to the upper surface 822.

In one aspect, the IPD component 800 may be configured to attach to the support 102. In one aspect, the IPD component 800 may be configured to directly attached to the support 102. In one aspect, the IPD component 800 may be configured for baseband impedance suppression.

The disclosed implementations of the thermal bridge 208 and/or the thermal bridge 218 may be configured to mitigate the high temperatures developed in the component 200, such as on the substrate board 202. In particular, implementations of the substrate board 202 that may be a PCB, a PCB-based IPD, integrated PCB based components, and/or the like. Additionally, disclosed implementations of the thermal bridge 208 and/or the thermal bridge 218 may be integrated with an additional component or components for additional electrical functionality as described herein.

Figure 12:
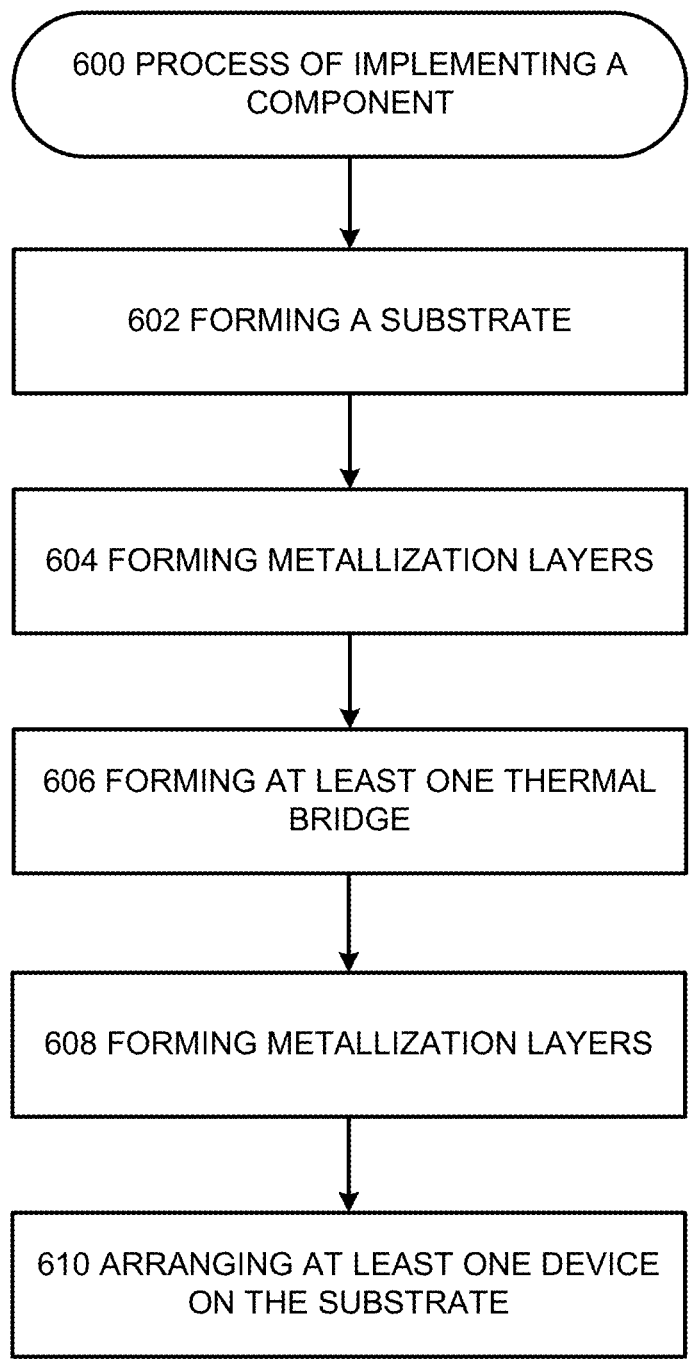
FIG. 12 illustrates a process of implementing the component according to the disclosure.

FIG. 12 illustrates a process of implementing the component according to the disclosure.

In particular, FIG. 12 illustrates a process of implementing a component 600 that relates to the component 200 as described herein. It should be noted that the aspects of the process of implementing a component 600 may be performed in a different order consistent with the aspects described herein. Additionally, it should be noted that portions of the process of implementing a component 600 may be performed in a different order consistent with the aspects described herein. Moreover, the process of implementing a component 600 may be modified to have more or fewer processes consistent with the various aspects disclosed herein. Additionally, the process of implementing a component 600 may include any other aspects of the disclosure described herein.

Initially, the process of implementing a component 600 may include a process of forming a substrate 602. More specifically, the forming a substrate 602 may include forming the substrate board 202. In this regard, the substrate board 202 may be constructed, configured, and/or arranged as described herein. Additionally, the at least one first via 210 and/or the at least one second via 220 may be formed in the substrate board 202.

Further, the process of implementing a component 600 may include forming metallization layers 604. More specifically, the first trace 204, the second grounded trace 216, the second trace 214, the bottom metal 226, and/or the like may be constructed, configured, and/or arranged as described herein on at least a portion of the substrate board 202.

The process of forming the metallization layer 604 may include utilizing one or more manufacturing techniques including print screening for solder paste, print screening for epoxy, silk screen printing processes, photoengraving processes, print onto transparent film processes, photo mask processes in combination with etching processes, photo-sensitized board processes, laser resist ablation processes, milling processes, laser etching processes, direct metal printing processes, and/or like processes.

Further, the process of implementing a component 600 may include a process of forming at least one thermal bridge 606. More specifically, the forming at least one thermal bridge 606 may include forming the thermal bridge 208 and/or the thermal bridge 218. In this regard, the thermal bridge 208 and/or the thermal bridge 218 may be constructed, configured, and/or arranged as described herein. In aspects, the thermal bridge 208 and/or the thermal bridge 218 may be formed from a substrate as described herein. In this aspect, the thermal bridge 208 and/or the thermal bridge 218 may be cut from a substrate and may include further processing steps to form the resulting shape of the thermal bridge 208 and/or the thermal bridge 218. For example, the thermal bridge 208 and/or the thermal bridge 218 may be cut from a substrate with a wafer saw. Additionally, in aspects the at least one via 228 and/or the at least one via 266 may be formed in the thermal bridge 208 and/or the thermal bridge 218.

Further, the process of implementing a component 600 may include forming metallization layers 608. More specifically, the bottom metal 224, the first top metal 230, the second top metal 232, the resistor 234, the top metal layer 264, the at least one via 266, and/or the like may be constructed, configured, and/or arranged as described herein on at least a portion of the thermal bridge 208 and/or the thermal bridge 218.

The forming metallization layers 608 may include utilizing one or more manufacturing techniques including print screening for solder paste, print screening for epoxy, silk screen printing processes, photoengraving processes, print onto transparent film processes, photo mask processes in combination with etching processes, photo-sensitized board processes, laser resist ablation processes, milling processes, laser etching processes, direct metal printing processes, and/or like processes.

Additionally, the process of implementing a component 600 may include arranging at least one device on the substrate 610. More specifically, the circuit component 250, the thermal bridge 208, and/or the thermal bridge 218 may be constructed, configured, and/or arranged as described herein on the substrate board 202. In one aspect, the circuit component 250, the thermal bridge 208, and/or the thermal bridge 218 may be arranged as described herein on the substrate board 202 with an adhesive, soldering, sintering, eutectic bonding, ultrasonically welding, and/or the like as described herein. More specifically, the arranging at least one device on the substrate 610 may include implementing a pick and place assembly to place the circuit component 250, the thermal bridge 208, and/or the thermal bridge 218 on a plurality of configurations of the substrate board 202 arranged in a panel.

The process of implementing a component 600 may include implementing a reflow process with the panel. The process of implementing a component 600 may include cutting the panel and/or the wafer utilizing cutting equipment such as wafer, circuit board, or package sawing equipment to singulate the component 200 from the panel or the wafer, which may have the advantage that the component 200 may be arranged on dicing tape on a ring frame, which can be directly loaded to the Die Attach equipment for subsequent assembly into package 100.

In one aspect, the process of implementing a component 600 may include processing utilizing a surface mount technology (SMT) line. A surface mount technology (SMT) line may utilize numerous processes including solder printing, component placement, solder reflow, and/or the like. additional processes may include a flux cleaning step to remove all flux residues, wire bonding, dicing, mounting to dicing tape, dicing, either mechanical sawing or laser cutting, or a combination of both, and component testing. Additionally, the component 200 may be arranged on dicing tape that may then serve as input for die attach equipment.

Figure 13:
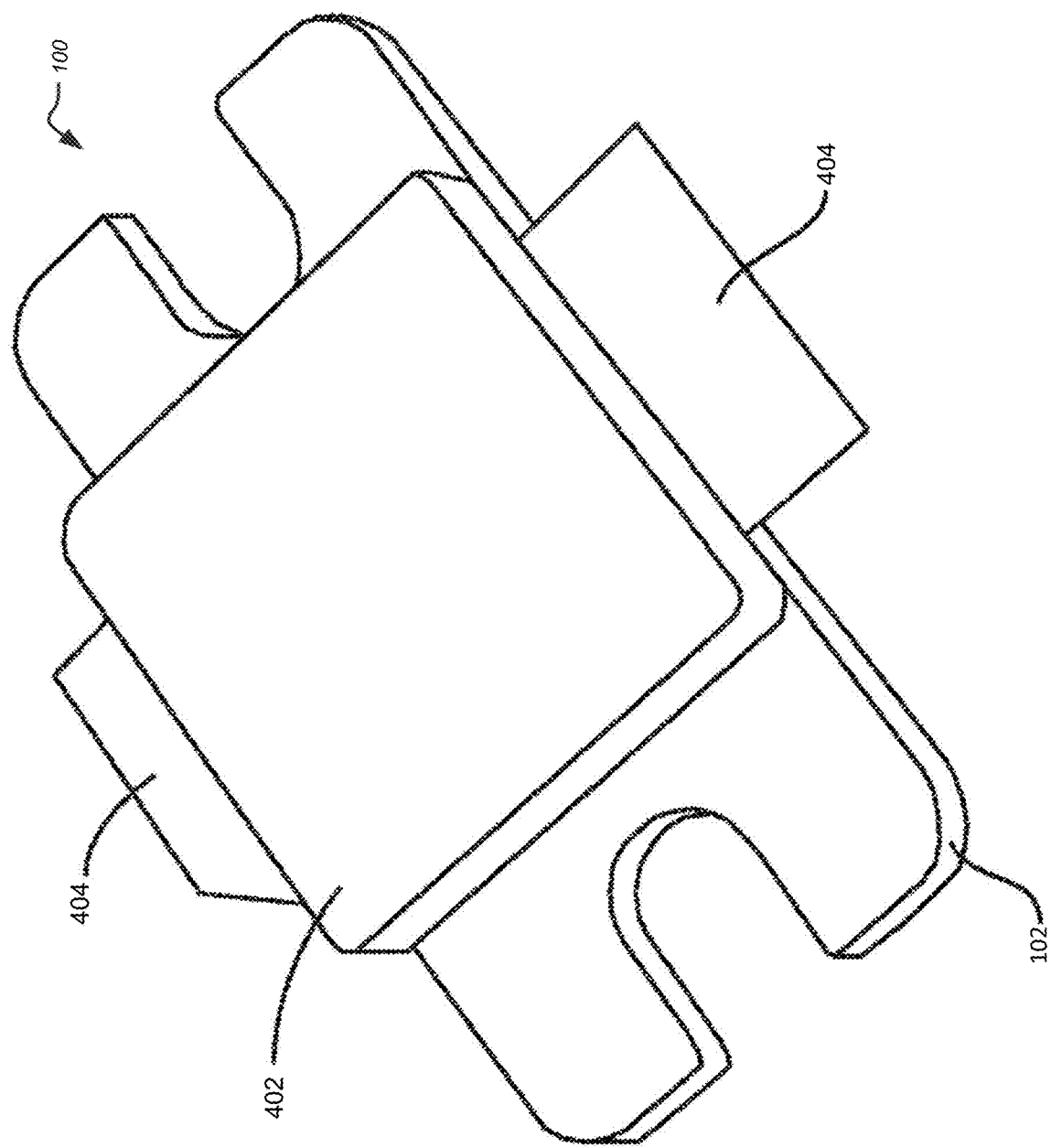
FIG. 13 illustrates a perspective view of a package according to the disclosure.

FIG. 13 illustrates a perspective view of a package according to the disclosure.

Figure 14:
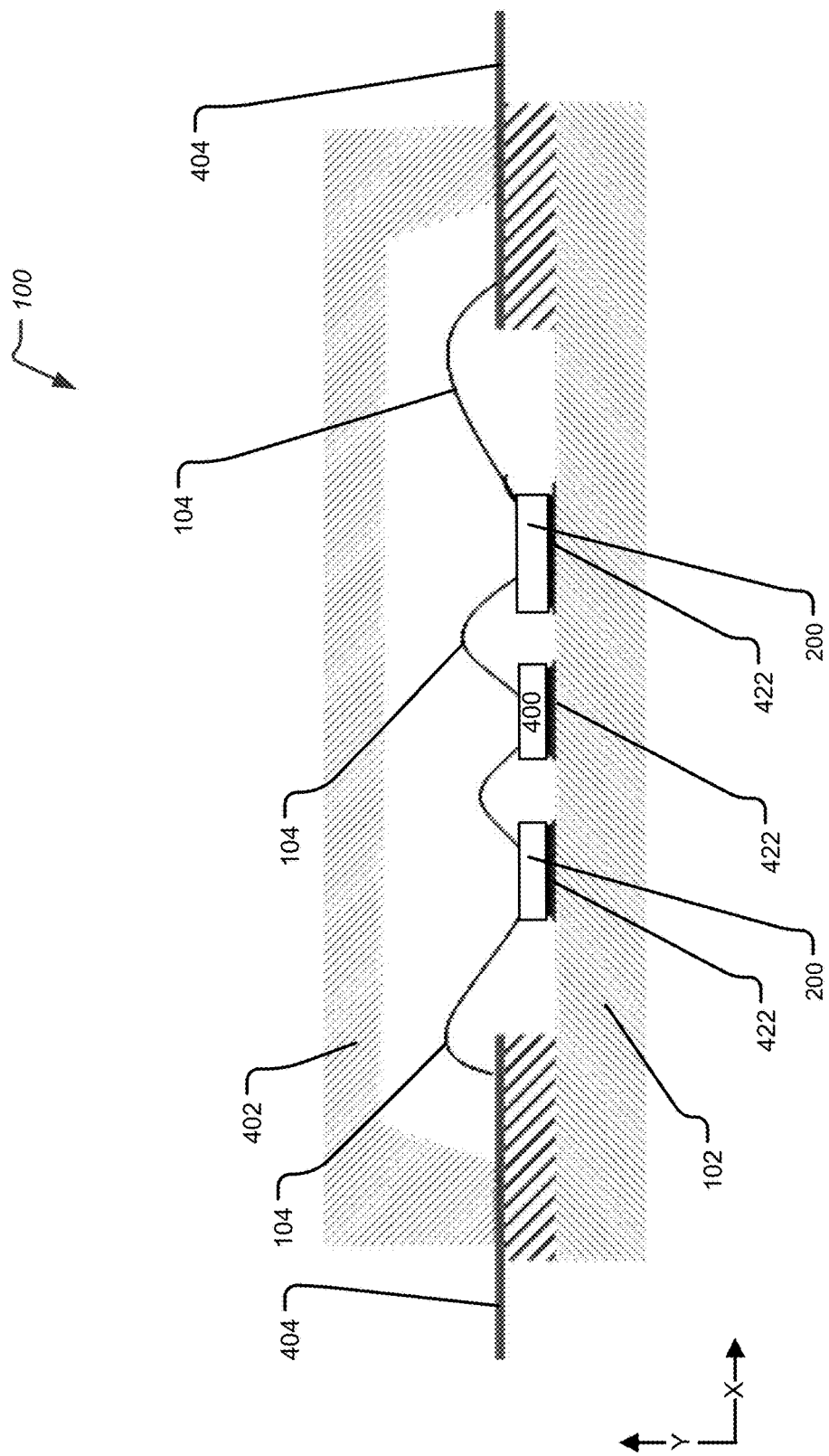
FIG. 14 illustrates a cross-sectional view of the package according to the disclosure.

FIG. 14 illustrates a cross-sectional view of the package according to the disclosure.

The aspects of FIG. 13 and FIG. 14 may include any one or more features as described herein. In particular, FIG. 13 and FIG. 14 show an exemplary implementation of the package 100 that may include any one or more other features, components, arrangements, and the like as described herein. In particular, FIG. 13 and FIG. 14 show the package 100 that may be implemented as a RF package, a RF amplifier package, a RF power amplifier package, a RF power transistor package, a RF power amplifier transistor package, and/or the like as described herein.

With reference to FIG. 13, the package 100 may include a ceramic body 402 and one or more metal contacts 404. In other aspects, the package 100 may include a plurality of the one or more metal contacts 404; and in aspects the package 100 may include a plurality of parallel implementations of the one or more metal contacts 404.

With reference to FIG. 14, the package 100 may include one or more semiconductor devices 400, the support 102, at least one implementation of the component 200.

The component 200 may be implemented as at least part of a RF device as described herein. The component 200 may implement matching networks, harmonic termination circuitry, integrated passive devices (IPD), capacitors, resistors, inductors, and/or the like. In aspects, the component 200 may be used for matching networks, pre-matching, bias-decoupling, thermal-grounding, and/or the like in RF power products and/or the like.

Inside the package 100, the one or more semiconductor devices 400 may be attached to the support 102 via a die attach material 422. One or more interconnects 104 may couple the one or more semiconductor devices 400 to a first one of the one or more metal contacts 404, a second one of the one or more metal contacts 404, the component 200, and/or the like. Additionally, inside the package 100, the component 200 may be arranged on the support 102 via a die attach material 422 with the one or more interconnects 104 shown in an exemplary configuration that may connect between the package 100, the component 200, and/or the one or more semiconductor devices 400. The support 102 may dissipate the heat generated by the one or more semiconductor devices 400, the component 200, while simultaneously isolating and protecting the one or more semiconductor devices 400 and the component 200 from the outside environment. In aspects, the die attach material 422 may utilize an adhesive, soldering, sintering, eutectic bonding, thermal compression bonding, ultrasonic bonding/welding, a clip component, and/or the like as described herein.

The one or more semiconductor devices 400 may be implemented as one or more of a wide band-gap semiconductor device, an ultra-wideband device, a GaN based device, a LDMOS (Laterally-Diffused Metal-Oxide Semiconductor) device, a Metal Semiconductor Field-Effect Transistor (MESFET), a Metal Oxide Field Effect Transistor (MOSFET), a Junction Field Effect Transistor (JFET), a Bipolar Junction Transistor (BJT), an Insulated Gate Bipolar Transistor (IGBT), a high-electron-mobility transistor (HEMT), a Wide Band Gap (WBG) semiconductor, a power module, a gate driver, a component such as a General-Purpose Broadband component, a Telecom component, a L-Band component, a S-Band component, a X-Band component, a C-Band component, a Ku-Band component, a Satellite Communications component, a Doherty configuration, and/or the like.

The package 100 may be implemented to include an open cavity configuration suitable for use with the component 200 of the disclosure. In particular, the open cavity configuration may utilize an open cavity package design. In some aspects, the open cavity configuration may include a lid or other enclosure for protecting interconnects, circuit components, the component 200, the one or more semiconductor devices 400, and/or the like.

The one or more interconnects 104 may utilize ball bonding, wedge bonding, compliant bonding, ribbon bonding, metal clip attach, and/or the like. In one aspect, the one or more interconnects 104 may utilize the same type of connection. In one aspect, the one or more interconnects 104 may utilize different types of connections.

The one or more interconnects 104 may be include various metal materials including one or more of aluminum, copper, silver, gold, and/or the like. In one aspect, the one or more interconnects 104 may utilize the same type of metal. In one aspect, the one or more interconnects 104 may utilize different types of metal. The one or more interconnects 104 may connect to one or more bonding pads by an adhesive, soldering, sintering, eutectic bonding, thermal compression bonding, ultrasonic bonding/welding, a clip component, and/or the like as described herein.

The support 102 may be implemented as a metal submount and may be implemented as a support, a surface, a package support, a package surface, a package support surface, a flange, a metal flange, a heat sink, a common source support, a common source surface, a common source package support, a common source package surface, a common source package support surface, a common source flange, a common source heat sink, a leadframe, a metal leadframe and/or the like. The support 102 may include an insulating material, a dielectric material, and/or the like.

Figure 15:
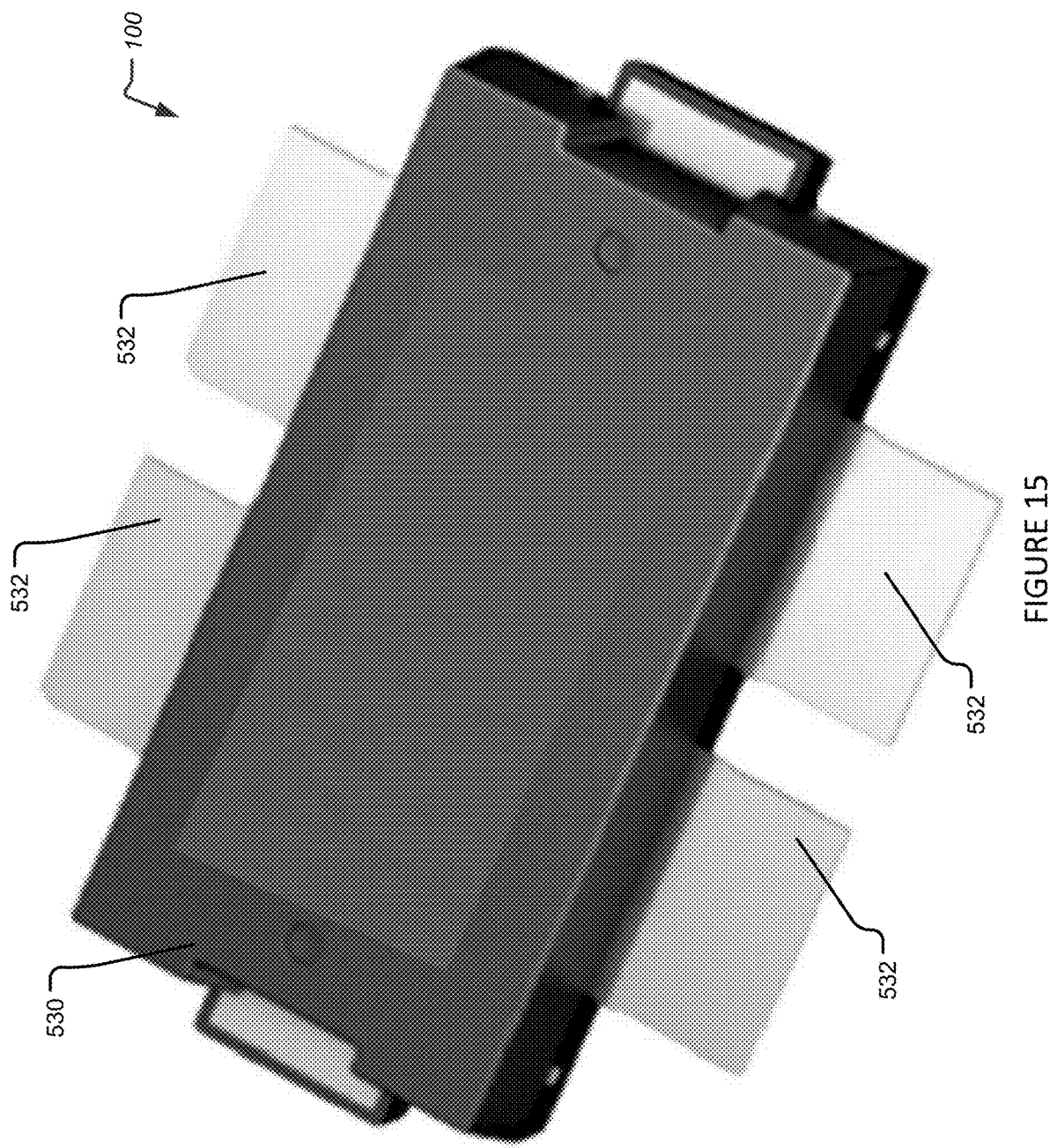
FIG. 15 illustrates a perspective view of a package according to the disclosure.

FIG. 15 illustrates a perspective view of a package according to the disclosure.

Figure 16:
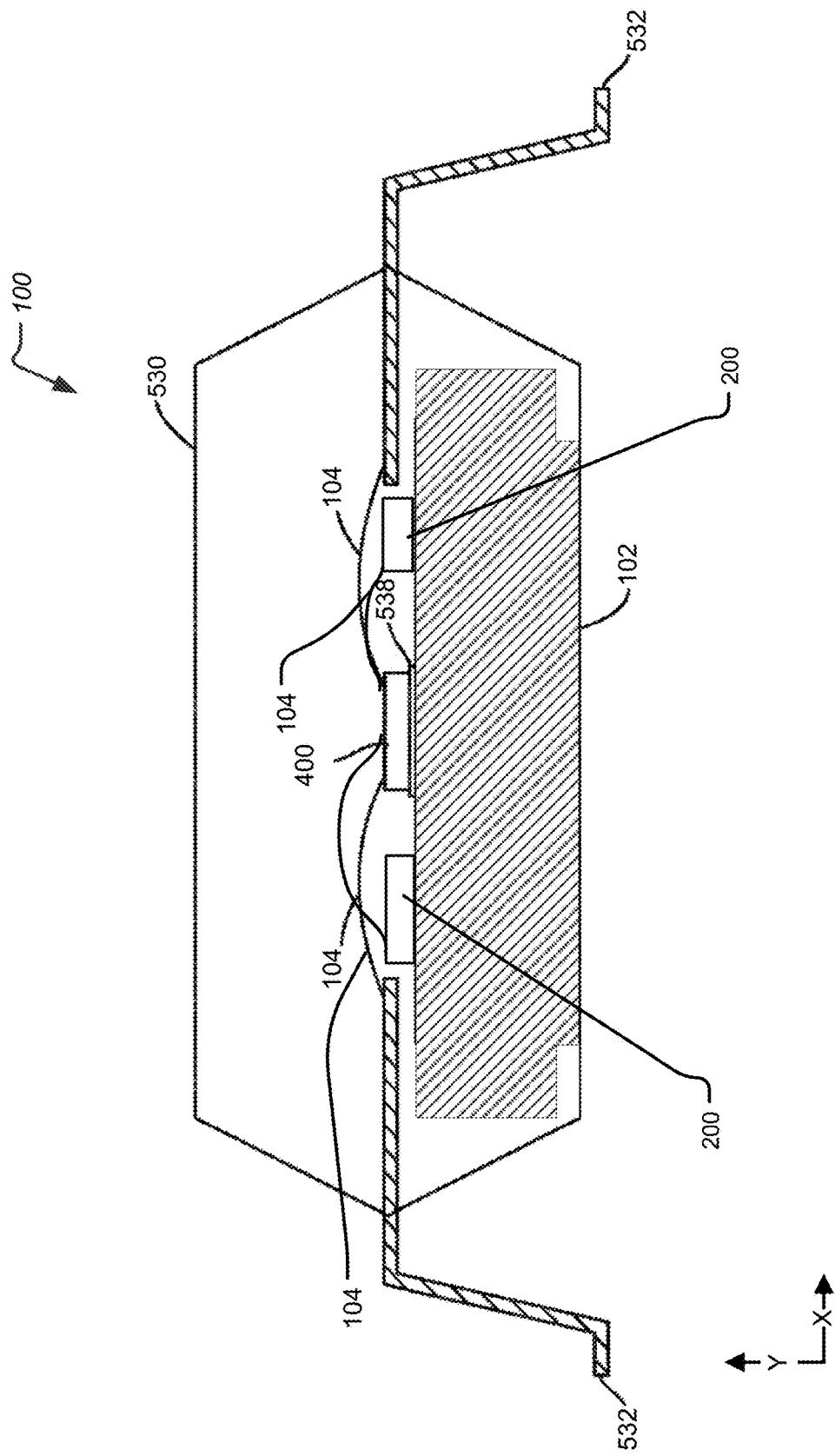
FIG. 16 illustrates a cross-sectional view of the package according to FIG. 15.

FIG. 16 illustrates a cross-sectional view of the package according to FIG. 15.

In particular, FIG. 15 and FIG. 16 show another exemplary implementation of the package 100 that may include any one or more other features, components, arrangements, and the like as described herein. In particular, FIG. 15 and FIG. 16 show the package 100 may be implemented as a RF package, a RF amplifier package, a RF power amplifier package, a RF power transistor package, a RF power amplifier transistor package, and/or the like as described herein. The package 100 may include the one or more semiconductor devices 400, the component 200, and/or the like.

Additionally, inside the package 100, the component 200 may be arranged on the support 102 as described herein with the one or more interconnects 104 shown in an exemplary configuration. Moreover, inside the package 100, the component 200 may be arranged on the support 102 as described herein with the one or more interconnects 104 shown in an exemplary configuration. The package 100 may include an over-mold 530, one or more input/output pins 532, and the support 102. The over-mold 530 may substantially surround the one or more semiconductor devices 400, which are mounted on the support 102 using a die attach material 538. The over-mold 530 may be formed of a plastic or a plastic polymer compound, which may be injection molded around the support 102, the one or more semiconductor devices 400, the component 200, and/or the like, thereby providing protection from the outside environment. The one or more semiconductor devices 400, the component 200 may be coupled to the one or more input/output pins 532 via the one or more interconnects 104.

The one or more interconnects 104 may connect to the one or more bonding pads. The one or more interconnects 104 may be implemented as one or more wires, wire bonds, leads, vias, edge platings, circuit traces, tracks, clips, and/or the like. In one aspect, the one or more interconnects 104 may utilize the same type of connection. In one aspect, the one or more interconnects 104 may utilize different types of connections.

In one aspect, the over-mold configuration may substantially surround the one or more semiconductor devices 400, the component 200, and/or the like. The over-mold configuration may be formed of a plastic, a mold compound, a plastic compound, a polymer, a polymer compound, a plastic polymer compound, and/or the like. The over-mold configuration may be injection molded, transfer molded, and/or compression molded around the one or more semiconductor devices 400, the component 200, and/or the like, thereby providing protection for the component 200, the one or more semiconductor devices 400, and other components of the package 100 from the outside environment.

Figure 17:
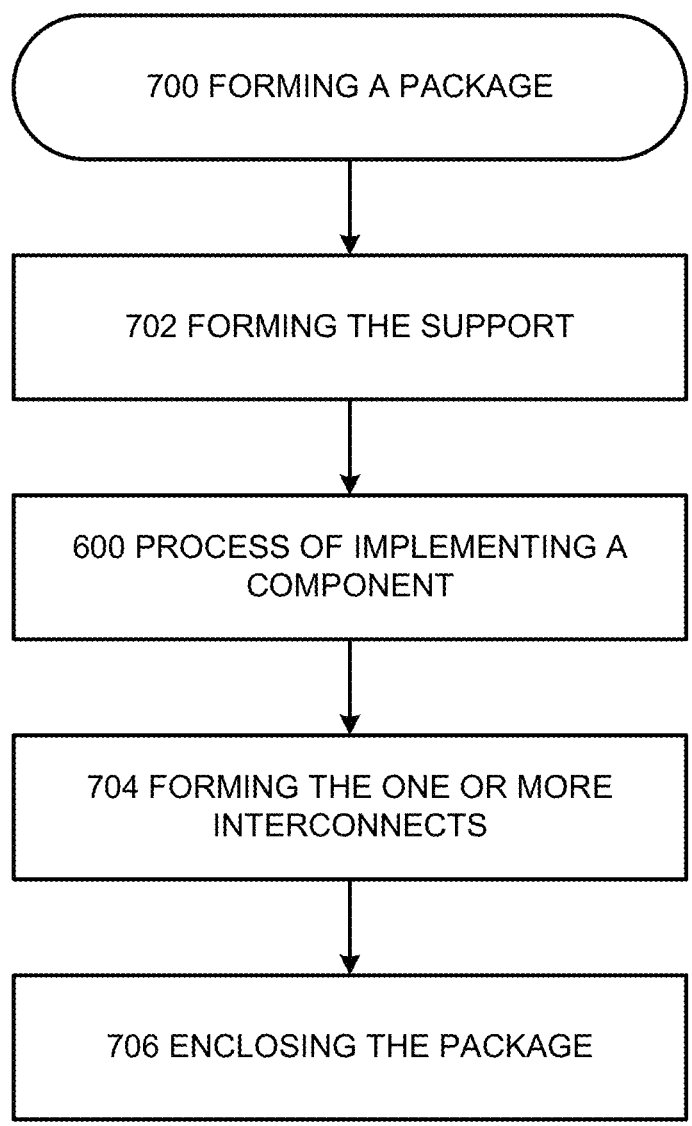
FIG. 17 illustrates a process of making a package according to the disclosure.

FIG. 17 illustrates a process of making a package according to the disclosure.

In particular, FIG. 17 illustrates a process of forming a package 700 that relates to the package 100 as described herein. It should be noted that the aspects of the process of forming a package 700 may be performed in a different order consistent with the aspects described herein. Additionally, it should be noted that portions of the process of forming a package 700 may be performed in a different order consistent with the aspects described herein. Moreover, the process of forming a package 700 may be modified to have more or fewer processes consistent with the various aspects disclosed herein. Additionally, the process of forming a package 700 may include any other aspects of the disclosure described herein.

Initially, the process of forming a package 700 may include a process of forming the support 702. More specifically, the support 102 may be constructed, configured, and/or arranged as described herein. In one aspect, the process of forming the support 702 may include forming the support 102 as a support, a surface, a package support, a package surface, a package support surface, a flange, a heat sink, a common source heat sink, and/or the like.

The process of forming a package 700 may include the process of implementing a component 600. More specifically, the component 200 may be constructed, configured, and/or arranged as described herein with reference to FIG. 12 and the associated description thereof. Thereafter, the process of implementing a component 600 may further include attaching the component 200 to the support 102. In this regard, the component 200 may be mounted on the upper surface of the support 102 and/or the component 200 by an adhesive, soldering, sintering, eutectic bonding, ultrasonically welding, and/or the like as described herein.

The process of forming a package 700 may include a process of forming the one or more interconnects 704. More specifically, the one or more interconnects 104 may be constructed, configured, and/or arranged as described herein. In one aspect, the process of forming the one or more interconnects 704 may include forming the one or more interconnects 104 by forming one or more wires, leads, vias, edge platings, circuit traces, tracks, and/or the like. In one aspect, the process of forming the one or more interconnects 704 may include connecting the one or more interconnects 704 by an adhesive, soldering, sintering, eutectic bonding, ultrasonic welding, a clip component, and/or the like as described herein.

The process of forming a package 700 may include a process of enclosing the package 706. More specifically, the package 100 may be constructed, configured, and/or arranged as described herein. In one aspect, the process of enclosing the package 706 may include forming an open cavity configuration, an over-mold configuration, or the like.

The following are a number of nonlimiting EXAMPLES of aspects of the disclosure.

One EXAMPLE: the component includes a substrate board. The component in addition includes a thermal bridge structured and arranged on the substrate board. The component moreover includes where the thermal bridge is configured to transfer heat from the substrate board including an area adjacent to or on a hotspot of the substrate board. The component also includes where the thermal bridge is configured to transfer the heat to another location on the substrate board for removal of the heat from the substrate board. The component further includes where the thermal bridge includes silicon carbide.

The above-noted EXAMPLE may further include any one or a combination of more than one of the following EXAMPLES:

The component of the above-noted EXAMPLE where the thermal bridge is connected to two points on the substrate board. The component of the above-noted EXAMPLE includes a first trace on the substrate board, a first grounded trace on the substrate board, at least one first via in the substrate board, a circuit component on the substrate board, a second grounded trace on the substrate board, and at least one second via in the substrate board, where the thermal bridge is configured to transfer heat from the substrate board including an area adjacent the first trace. The component of the above-noted EXAMPLE where the circuit component is located on or adjacent the first trace. The component of the above-noted EXAMPLE where the thermal bridge is connected to the first trace and the first grounded trace. The component of the above-noted EXAMPLE where the thermal bridge includes a bottom metal arranged at locations adjacent the first trace and/or the at least one first via. The component of the above-noted EXAMPLE where the circuit component includes a surface mounted device (SMD), an SMD capacitor, and/or a capacitor. The component of the above-noted EXAMPLE includes a second trace, where the thermal bridge includes a bottom metal arranged at locations adjacent a first grounded trace and/or the at least one first via; and where the thermal bridge includes the bottom metal arranged at locations adjacent the second trace. The component of the above-noted EXAMPLE where the second trace includes an inductor. The component of the above-noted EXAMPLE where the substrate board includes a bottom metal configured to transfer heat to and from the at least one first via; and where the bottom metal is configured to transfer heat to and from a support. The component of the above-noted EXAMPLE where thermal bridge includes a material that is anisotropic with respect to heat flow that conducts heat better along a particular axis of the material; and where the particular axis that better conducts heat is located parallel to an upper surface of the substrate board. The component of the above-noted EXAMPLE where the thermal bridge is configured to have matching thermal expansion to various components of the substrate board. The component of the above-noted EXAMPLE where the thermal bridge includes at least one via, a first top metal, a resistor, a second top metal; and where the resistor is arranged between the first top metal and the second top metal. The component of the above-noted EXAMPLE where the second top metal is configured as a wire bonding pad to connect the second top metal to another component. The component of the above-noted EXAMPLE where the thermal bridge is configured to connect to an integrated passive device (IPD) component. The component of the above-noted EXAMPLE where the integrated passive device (IPD) component is configured as a baseband termination circuit. The component of the above-noted EXAMPLE includes a topside heat sink arranged above and connected to the thermal bridge. The component of the above-noted EXAMPLE where the thermal bridge is configured as a mechanical support for the topside heat sink. The component of the above-noted EXAMPLE where the thermal bridge includes at least one via. The component of the above-noted EXAMPLE includes support stands configured to support the topside heat sink. The component of the above-noted EXAMPLE where the support stands are configured to transfer heat from the substrate board to the topside heat sink. The transistor device of the above-noted EXAMPLE includes the component the transistor device includes: a metal submount; and a transistor die arranged on said metal submount, where the component is arranged on said metal submount. The transistor device of the above-noted EXAMPLE where the transistor die includes one or multiple LDMOS transistor die. The transistor device of the above-noted EXAMPLE where the transistor die includes one or multiple GaN based HEMTs. The transistor device of the above-noted EXAMPLE where the transistor device includes a plurality of the transistor die. The transistor device of the above-noted EXAMPLE where the plurality of the transistor die are configured in a Doherty configuration.

One EXAMPLE: the process includes providing a substrate board. The process in addition includes arranging a thermal bridge on the substrate board. The process moreover includes where the thermal bridge is configured to transfer heat from the substrate board including an area adjacent to or on a hotspot of the substrate board. The process also includes where the thermal bridge is configured to transfer the heat to another location on the substrate board for removal of the heat from the substrate board. The process further includes where the thermal bridge includes silicon carbide.

The above-noted EXAMPLE may further include any one or a combination of more than one of the following EXAMPLES:

The process of the above-noted EXAMPLE where the thermal bridge is connected to two points on the substrate board. The process of the above-noted EXAMPLE includes providing a first trace on the substrate board, a first grounded trace on the substrate board, at least one first via in the substrate board, a circuit component on the substrate board, a second grounded trace on the substrate board, and at least one second via in the substrate board, where the thermal bridge is configured to transfer heat from the substrate board including an area adjacent the first trace. The process of the above-noted EXAMPLE where the circuit component is located on or adjacent the first trace. The process of the above-noted EXAMPLE where the thermal bridge is connected to the first trace and the first grounded trace. The process of the above-noted EXAMPLE where the thermal bridge includes a bottom metal arranged at locations adjacent the first trace and/or the at least one first via. The process of the above-noted EXAMPLE where the circuit component includes a surface mounted device (SMD), an SMD capacitor, and/or a capacitor. The process of the above-noted EXAMPLE where the substrate board includes a bottom metal configured to transfer heat to and from the at least one first via; and where the bottom metal is configured to transfer heat to and from a support. The process of the above-noted EXAMPLE includes providing a second trace, where the thermal bridge includes a bottom metal arranged at locations adjacent a first grounded trace and/or the at least one first via; and where the thermal bridge includes the bottom metal arranged at locations adjacent the second trace. The process of the above-noted EXAMPLE where the second trace includes an inductor. The process of the above-noted EXAMPLE where thermal bridge includes a material that is anisotropic with respect to heat flow that conducts heat better along a particular axis of the material; and where the particular axis that better conducts heat is located parallel to an upper surface of the substrate board. The process of the above-noted EXAMPLE where the thermal bridge is configured to have matching thermal expansion to various components of the substrate board. The process of the above-noted EXAMPLE where the thermal bridge includes at least one via, a first top metal, a resistor, a second top metal; and where the resistor is arranged between the first top metal and the second top metal. The process of the above-noted EXAMPLE where the second top metal is configured as a wire bonding pad to connect the second top metal to another component. The process of the above-noted EXAMPLE where the thermal bridge is configured to connect to an integrated passive device (IPD) component. The process of the above-noted EXAMPLE where the integrated passive device (IPD) component is configured as a baseband termination circuit. The process of the above-noted EXAMPLE includes arranging a topside heat sink above and connected to the thermal bridge. The process of the above-noted EXAMPLE where the thermal bridge is configured as a mechanical support for the topside heat sink. The process of the above-noted EXAMPLE where the thermal bridge includes at least one via. The process of the above-noted EXAMPLE includes arranging support stands to support the topside heat sink. The process of the above-noted EXAMPLE where the support stands are configured to transfer heat from the substrate board to the topside heat sink. The process of the above-noted EXAMPLE includes: providing a metal submount; arranging a transistor die on said metal submount; and arranging the substrate board on said metal submount. The process of the above-noted EXAMPLE where the transistor die includes one or multiple LDMOS transistor die. The process of the above-noted EXAMPLE where the transistor die includes one or multiple GaN based HEMTs. The process of the above-noted EXAMPLE where the transistor die includes a plurality of the transistor die. The process of the above-noted EXAMPLE where the plurality of the transistor die are configured in a Doherty configuration.

The adhesive of the disclosure may be utilized in an adhesive bonding process that may include applying an intermediate layer to connect surfaces to be connected. The adhesive may be organic or inorganic; and the adhesive may be deposited on one or both surfaces of the surface to be connected. The adhesive may be utilized in an adhesive bonding process that may include applying adhesive material with a particular coating thickness, at a particular bonding temperature, for a particular processing time while in an environment that may include applying a particular tool pressure. In one aspect, the adhesive may be a conductive adhesive, an epoxy-based adhesive, a conductive epoxy-based adhesive, and/or the like.

The solder of the disclosure may be utilized to form a solder interface that may include solder and/or be formed from solder. The solder may be any fusible metal alloy that may be used to form a bond between surfaces to be connected. The solder may be a lead-free solder, a lead solder, a eutectic solder, or the like. The lead-free solder may contain tin, copper, silver, bismuth, indium, zinc, antimony, traces of other metals, and/or the like. The lead solder may contain lead, other metals such as tin, silver, and/or the like. The solder may further include flux as needed.

The sintering of the disclosure may utilize a process of compacting and forming a conductive mass of material by heat and/or pressure. The sintering process may operate without melting the material to the point of liquefaction. The sintering process may include sintering of metallic nano or hybrid powders in pastes or epoxies. The sintering process may include sintering in a vacuum. The sintering process may include sintering with the use of a protective gas.

The eutectic bonding of the disclosure may utilize a eutectic soldering process that may form a eutectic system. The eutectic system may be used between surfaces to be connected. The eutectic bonding may utilize metals that may be alloys and/or intermetallics that transition from solid to liquid state, or from liquid to solid state, at a specific composition and temperature. The eutectic alloys may be deposited by sputtering, evaporation, electroplating, and/or the like.

The ultrasonically welding of the disclosure may utilize a process whereby high-frequency ultrasonic acoustic vibrations are locally applied to components being held together under pressure. The ultrasonically welding may create a solid-state weld between surfaces to be connected. In one aspect, the ultrasonically welding may include applying a sonicated force.

While the disclosure has been described in terms of exemplary aspects, those skilled in the art will recognize that the disclosure can be practiced with modifications in the spirit and scope of the appended claims. These examples given above are merely illustrative and are not meant to be an exhaustive list of all possible designs, aspects, applications or modifications of the disclosure.

What is claimed is:
1. A component comprising:
a substrate board;
a thermal bridge structured and arranged on the substrate board;
and a first trace on the substrate board,
a first grounded trace on the substrate board,
at least one first via in the substrate board,
and a circuit component on the substrate board,
wherein the thermal bridge is configured to transfer heat from the substrate board including an area adjacent to or on a hotspot of the substrate board;
wherein the thermal bridge is configured to transfer the heat to another location on the substrate board for removal of the heat from the substrate board;
wherein the thermal bridge comprises silicon carbide;

wherein the thermal bridge is configured to transfer heat from the substrate board including an area adjacent the first trace;

wherein the thermal bridge comprises a bottom metal arranged at locations adjacent the first trace and/or the at least one first via; and wherein the thermal bridge is configured to have matching thermal expansion to the circuit component on the substrate board.

2. The component according to claim 1 wherein the thermal bridge is connected to two points on the substrate board.

3. The component according to claim 1 further comprising a first trace on the substrate board, a first grounded trace on the substrate board, at least one first via in the substrate board, a circuit component on the substrate board, a second grounded trace on the substrate board, and at least one second via in the substrate board, wherein the thermal bridge is configured to transfer heat from the substrate board including an area adjacent the first trace.

4. The component according to claim 3 wherein the thermal bridge is connected to the first trace and the first grounded trace.

5. The component according to claim 3 wherein the circuit component comprises a surface mounted device (SMD), an SMD capacitor, and/or a capacitor.

6. The component according to claim 3 further comprising a second trace, wherein the thermal bridge comprises a bottom metal arranged at locations adjacent a first grounded trace and/or the at least one first via; and wherein the thermal bridge comprises the bottom metal arranged at locations adjacent the second trace.

7. The component according to claim 6 wherein the second trace comprises an inductor.

8. The component according to claim 1 wherein the substrate board comprises a bottom metal configured to transfer heat to and from the at least one first via; and wherein the bottom metal is configured to transfer heat to and from a support.

9. The component according to claim 1 wherein thermal bridge comprises a material that is anisotropic with respect to heat flow that conducts heat better along a particular axis of the material; and wherein the particular axis that better conducts heat is located parallel to an upper surface of the substrate board.

10. The component according to claim 1 wherein the thermal bridge comprises at least one via, a first top metal, a resistor, a second top metal; and wherein the resistor is arranged between the first top metal and the second top metal.

11. The component according to claim 10 wherein the second top metal is configured as a wire bonding pad to connect the second top metal to another component.

12. The component according to claim 1 wherein the thermal bridge is configured to connect to an integrated passive device (IPD) component.

13. The component according to claim 12 wherein the integrated passive device (IPD) component is configured as a baseband termination circuit.

14. The component according to claim 1 further comprising a topside heat sink arranged above and connected to the thermal bridge.

15. The component according to claim 14 wherein the thermal bridge is configured as a mechanical support for the topside heat sink.

16. The component according to claim 14 wherein the thermal bridge comprises at least one via.

17. The component according to claim 14 further comprising support stands configured to support the topside heat sink.

18. The component according to claim 17 wherein the support stands are configured to transfer heat from the substrate board to the topside heat sink.

19. A transistor device, comprising the component of claim 1, the transistor device further comprising:
a metal submount; and
a transistor die arranged on said metal submount,
wherein the component is arranged on said metal submount.

20. The transistor device according to claim 19 wherein the transistor die comprises one or multiple LDMOS transistor die.

21. The transistor device according to claim 19 wherein the transistor die comprises one or multiple GaN based HEMTs.

22. The transistor device according to claim 19 wherein the transistor device comprises a plurality of the transistor die.

23. The transistor device according to claim 22 wherein the plurality of the transistor die are configured in a Doherty configuration.

24. A process of implementing a component comprising:
providing a substrate board; and
arranging a thermal bridge on the substrate board;
and providing a first trace on the substrate board,
a first grounded trace on the substrate board,
at least one first via in the substrate board,
and a circuit component on the substrate board,
wherein the thermal bridge is configured to transfer heat from the substrate board including an area adjacent to or on a hotspot of the substrate board;
wherein the thermal bridge is configured to transfer the heat to another location on the substrate board for removal of the heat from the substrate board;
wherein the thermal bridge comprises silicon carbide;
wherein the thermal bridge is configured to transfer heat from the substrate board including an area adjacent the first trace;
wherein the thermal bridge comprises a bottom metal arranged at locations adjacent the first trace and/or the at least one first via; and
wherein the thermal bridge is configured to have matching thermal expansion to the circuit component on the substrate board.

* * * * *